(12) United States Patent
Watanuki et al.

(10) Patent No.: US 10,038,114 B2
(45) Date of Patent: Jul. 31, 2018

(54) SEMICONDUCTOR DEVICE AND MANUFACTURING METHOD THEREOF

(71) Applicant: Renesas Electronics Corporation, Koutou-ku, Tokyo (JP)

(72) Inventors: Shinichi Watanuki, Ibaraki (JP); Atsuro Inada, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/606,281

(22) Filed: May 26, 2017

(65) Prior Publication Data

US 2017/0263802 A1 Sep. 14, 2017

Related U.S. Application Data

(62) Division of application No. 15/062,153, filed on Mar. 6, 2016, now Pat. No. 9,696,489.

(30) Foreign Application Priority Data

Mar. 24, 2015 (JP) ................. 2015-060872

(51) Int. Cl.
*G02B 6/13* (2006.01)
*H01L 31/18* (2006.01)
*H01L 31/0232* (2014.01)

(52) U.S. Cl.
CPC ............ *H01L 31/18* (2013.01); *G02B 6/13* (2013.01); *H01L 31/02325* (2013.01)

(58) Field of Classification Search
None
See application file for complete search history.

(56) References Cited

U.S. PATENT DOCUMENTS 9,435,952 B2* 9/2016 Stephens ............. G02B 6/136
2002/0136481 A1 9/2002 Mule et al.
(Continued)

FOREIGN PATENT DOCUMENTS

JP 2012-027198 A 2/2012
JP 2013-041143 A 2/2013
(Continued)

OTHER PUBLICATIONS

Extended European Search Report, dated Jul. 27, 2016, in European Patent Application No. 16162130.5.
(Continued)

*Primary Examiner* — Uyen Chau N Le
*Assistant Examiner* — Chad H Smith
(74) *Attorney, Agent, or Firm* — Shapiro, Gabor and Rosenberger, PLLC

(57) ABSTRACT

A semiconductor substrate, an insulating layer made of silicon oxide formed on the semiconductor substrate and a semiconductor layer made of silicon formed on the insulating layer are provided, and the semiconductor layer constitutes an optical waveguide in an optical signal transmission line section and an optical modulator in an optical modulation section. Also, the insulating layer is removed except for a part thereof to have a hollow structure with a cavity, and both side surfaces and a lower surface of each of the semiconductor layers constituting the optical waveguide and the optical modulator are exposed and covered with air.

4 Claims, 24 Drawing Sheets

(56) References Cited

U.S. PATENT DOCUMENTS

2004/0017215 A1  1/2004  Mule et al.
2010/0247031 A1  9/2010  Hayakawa et al.
2014/0291717 A1  10/2014 Kitamura et al.

FOREIGN PATENT DOCUMENTS

JP  2013-178411 A  9/2013
JP  2014-149507 A  8/2014

OTHER PUBLICATIONS

Office Action, dated May 29, 2018, in Japanese Patent Application No. 2015-060872.

* cited by examiner

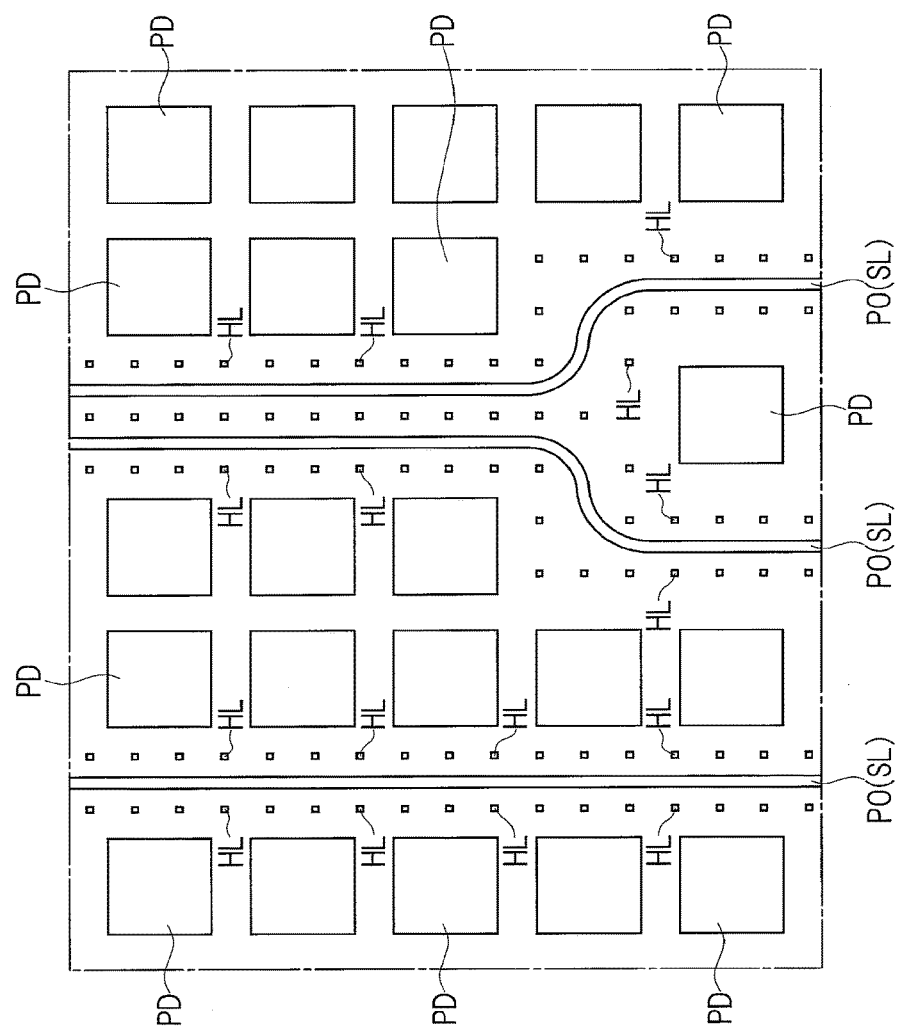

SEMICONDUCTOR DEVICE AND MANUFACTURING METHOD THEREOF

CROSS-REFERENCE TO RELATED APPLICATION

The present application claims priority from Japanese Patent Application No. 2015-060872 filed on Mar. 24, 2015, the content of which is hereby incorporated by reference into this application.

TECHNICAL FIELD OF THE INVENTION

The present invention relates to a semiconductor device and a manufacturing technology thereof, for example, a technology effectively applied to a semiconductor device having various optical devices in a semiconductor chip.

BACKGROUND OF THE INVENTION

Japanese Patent Application Laid-Open Publication No. 2012-027198 (Patent Document 1) describes an optical semiconductor device including an optical waveguide formed of a part of a semiconductor layer, a first impurity region which is formed in the semiconductor layer on one side of the optical waveguide and to which an impurity of a first conductivity type is introduced and a second impurity region which is formed in the semiconductor layer on the other side of the optical waveguide and to which an impurity of a second conductivity type opposite to the first conductivity type is introduced.

SUMMARY OF THE INVENTION

In an optical waveguide made of silicon, light partially leaks to the outside in the range nearly equal to the wavelength during the propagation through the optical waveguide. In order to reduce the propagation loss due to the leakage of light, the optical waveguide is covered with an insulating film made of silicon oxide around the entire perimeter (in all directions).

However, even when the optical waveguide is covered with an insulating film made of silicon oxide around the entire perimeter (in all directions), the lights propagating through the respective optical waveguides interfere with each other and the propagation loss cannot be reduced if the intervals between adjacent waveguides are narrow. For example, when the wavelength of the light propagating through the optical waveguide is 1.5 µm, the intervals between adjacent waveguides cannot be narrowed to less than 2 µm. This is one of the factors which prevents the high-density integration of the semiconductor device and restricts the size reduction of the semiconductor chip.

The other problems and novel characteristics of the present invention will be apparent from the description of the present specification and the accompanying drawings.

A semiconductor device of an embodiment includes: a semiconductor substrate; an insulating layer formed on the semiconductor substrate and made of silicon oxide; and a semiconductor layer formed on the insulating layer and made of silicon, and the semiconductor layer constitutes an optical waveguide. The insulating layer is removed except for a part thereof to have a hollow structure with a cavity, and both sides surfaces of the semiconductor layer constituting the optical waveguide are covered with air.

A manufacturing method of a semiconductor device of an embodiment includes the steps of: preparing an SOI substrate having a semiconductor substrate, an insulating layer made of silicon oxide and a semiconductor layer made of silicon; processing the semiconductor layer to form a plurality of optical waveguides; filling spaces between the adjacent optical waveguides with a first insulating film made of silicon nitride; and forming a second insulating film made of silicon oxide on the optical waveguides and the first insulating film. The method further includes the steps of: forming a hole penetrating through the first insulating film and the second insulating film; forming a third insulating film made of silicon nitride on the second insulating film with an inclusion of side surfaces and a bottom surface of the hole; removing the third insulating film at a bottom surface of the hole; supplying etchant from the hole to etch the insulating layer, thereby forming a cavity in the insulating layer and exposing both side surfaces and lower surfaces of the optical waveguides; and removing the first insulating film and the third insulating film.

According to an embodiment, it is possible to achieve the high-density integration of the semiconductor device and the size reduction of the semiconductor chip.

BRIEF DESCRIPTIONS OF THE DRAWINGS

FIG. 5B is a plan view showing the principal part of the manufacturing process of a semiconductor device continued from FIG. 4;

DESCRIPTIONS OF THE PREFERRED EMBODIMENTS

Figure 1:
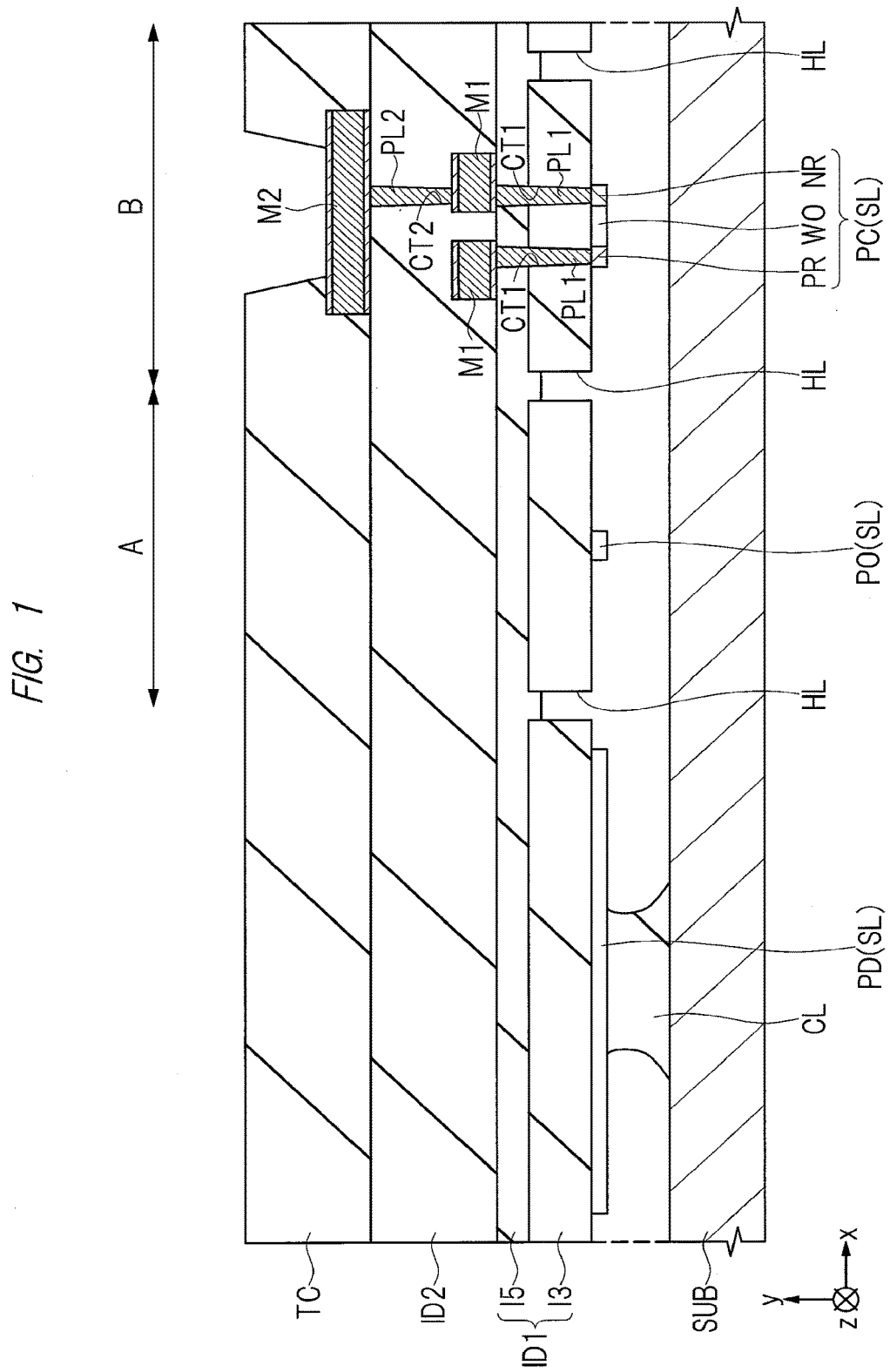
FIG. 1 is a cross-sectional view showing the principal part of a semiconductor device of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Further, even when mentioning that constituent elements or the like are "made of A", "constituted of A", "have A" and "include A", elements other than A are of course not excluded except the case where it is particularly specified that A is the only element thereof. Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical value and the range described above.

Further, in the embodiments described below, for example, silicon oxide is represented as $SiO_2$, silicon nitride is represented as $Si_3N_4$ and silicon oxynitride is represented as SiON, but these include the composition deviated from stoichiometric composition. In addition, components having the same function are denoted by the same reference characters throughout the drawings for describing the embodiments, and the repetitive description thereof will be omitted.

Hereinafter, embodiments of the present invention will be described in detail with reference to the accompanying drawings.

First Embodiment

In recent years, the development of the technology to realize an optical communication module by fabricating an optical signal transmission line made of silicon (Si) and integrating various optical devices and electronic devices with using an optical circuit constituted of the optical signal transmission line as a platform, that is, the silicon photonics technology has been actively pursued.

The technology disclosed in the first embodiment is applied in particular to an optical device among various devices constituting a semiconductor device using the silicon photonics technology. For this reason, in the following description, a structure and a manufacturing method of a semiconductor device having an optical signal transmission line section and an optical modulation section integrated on an SOI substrate will be described. In addition, in the following description, an optical signal transmission line section and an optical modulation section of the optical device are illustrated as an example and a multilayer wiring with a two-layer structure is illustrated as an example, but the present invention is not limited to these.

<Structure of Semiconductor Device>

A structure of a semiconductor device of the first embodiment will be described with reference to FIG. 1. FIG. 1 is a cross-sectional view showing the principal part of a semiconductor device (optical signal transmission line section A and optical modulation section B) of the first embodiment. In practice, optical devices with a different structure such as a light receiving section and the like are included as described above.

1. Optical Signal Transmission Line Section

As shown in FIG. 1, various optical signal transmission lines (referred to also as optical signal line) are formed in the optical signal transmission line section A. Here, a rectangular optical waveguide (referred to also as core layer) PO will be described as an example of the optical signal transmission line.

The optical waveguide PO is constituted of a semiconductor layer (referred to also as SOI layer) SL made of silicon (Si) formed on a semiconductor substrate SUB made of single crystal silicon (Si) with an insulating layer (referred to also as BOX layer or lower cladding layer) CL interposed therebetween. A thickness of the insulating layer CL is, for example, 1 µm or more and less than 2 µm. A preferable range of a thickness of the semiconductor layer SL appears to be, for example, 100 nm to 300 nm (of course not limited to this range depending on other conditions), and a range around a center value of 200 nm appears to be the most preferable range.

The optical waveguide PO is processed into a plate-like shape and extends in a direction perpendicular to the plane of the paper (z direction shown in FIG. 1). Therefore, the optical signal introduced into the optical waveguide PO travels in the direction perpendicular to the plane of the paper. A height of the optical waveguide PO (dimension in a longitudinal direction (y direction shown in FIG. 1)) is, for example, about 200 nm.

The optical waveguide PO is covered with a first interlayer insulating film (referred to also as upper cladding layer) ID1, a second interlayer insulating film ID2 and a protection film TC. The first interlayer insulating film ID1 and the second interlayer insulating film ID2 are made of silicon oxide (SiO$_2$) whose refractive index at the wavelength of 1.5 μm is, for example, about 1.45, and the thickness thereof is, for example, about 1 μm. In addition, the protection film TC is made of silicon oxynitride (SiON) whose refractive index at the wavelength of 1.5 μm is, for example, about 1.82. A first-layer wiring M1 and a second-layer wiring M2 described later are not formed in the optical signal transmission line section A.

2. Optical Modulation Section

As shown in FIG. 1, an optical modulator PC which converts an electric signal into an optical signal is formed in the optical modulation section B. The optical modulator PC is constituted of the semiconductor layer SL made of silicon formed on the semiconductor substrate SUB with the insulating layer CL interposed therebetween. The optical modulator PC with a pin structure will be described by way of example.

The optical modulator PC extends in the direction perpendicular to the plane of the paper (z direction shown in FIG. 1) and has an optical waveguide (referred to also as core layer) WO formed in a center part thereof when viewed in a lateral direction (x direction shown in FIG. 1) orthogonal to the direction perpendicular to the plane of the paper. Therefore, the optical signal introduced into the optical waveguide WO travels in the direction perpendicular to the plane of the paper.

In the semiconductor layer SL on one side (left side in the drawing) of the optical waveguide WO, a p type impurity is introduced to form a p type semiconductor PR. The p type semiconductor PR is formed to be in parallel to the optical waveguide WO. Also, in the semiconductor layer SL on the other side (right side in the drawing) of the optical waveguide WO, an n type impurity is introduced to form an n type semiconductor NR. The n type semiconductor NR is formed to be in parallel to the optical waveguide WO. Namely, the semiconductor layer SL between the p type semiconductor PR and the n type semiconductor NR serves as the optical waveguide WO made of intrinsic semiconductor, so that the pin structure is formed. An electrode (first plug PL1) is connected to each of the p type semiconductor PR and the n type semiconductor NR.

The carrier density in the optical waveguide WO made of intrinsic semiconductor is changed by the voltage applied to the electrode, and a refractive index in the region is changed. Consequently, an effective refractive index to the light propagating through the optical modulator PC is changed, so that an optical phase output from the optical modulator PC can be changed.

The optical modulator PC is covered with the first interlayer insulating film ID1, and connection holes (referred to also as contact hole) CT1 each reaching the p type semiconductor PR and the n type semiconductor NR are formed in the first interlayer insulating film ID1. A first plug (referred to also as buried electrode or buried contact) PL1 made of a material containing tungsten (W) as a main conductive material is formed in the connection hole CT1, and the first plug PL1 electrically connects the p type semiconductor PR and the first-layer wiring M1 and connects the n type semiconductor NR and the first-layer wiring M1. The first-layer wiring M1 is made of, for example, a material containing aluminum (Al), copper (Cu) or aluminum-copper alloy (Al—Cu alloy) as a main conductive material.

Further, the first-layer wiring M1 is covered with the second interlayer insulating film ID2, and a connection hole (referred to also as via hole) CT2 reaching the first-layer wiring M1 is formed in the second interlayer insulating film ID2. A second plug (buried electrode or buried contact) PL2 made of a material containing tungsten (W) as a main conductive material is formed in the connection hole CT2, and the second plug PL2 electrically connects the first-layer wiring M1 and the second-layer wiring M2. The second-layer wiring M2 is made of, for example, a material containing aluminum (Al), copper (Cu) or aluminum-copper alloy (Al—Cu alloy) as a main conductive material.

The second-layer wiring M2 is covered with the protection film PC and the protection film PC is partially opened to expose an upper surface of the second-layer wiring M2.

<Characteristic and Effect of Structure of Semiconductor Device>

Further, as shown in FIG. 1, the insulating layer CL is removed except for a part thereof to have a hollow structure with a cavity. Therefore, the both side surfaces and the lower surface (surface facing toward the semiconductor substrate SUB) of each of the semiconductor layers SL constituting the optical waveguide PO and the optical modulator PC are exposed.

Since the refractive index of air is 1.0 and the refractive index of silicon oxide (SiO$_2$) is 1.45 (wavelength: 1.5 μm), the difference in refractive index between air and silicon (Si) is larger than that between silicon oxide (SiO$_2$) and silicon (Si).

An example in which the core layer is made of silicon (Si) and the cladding layer is made of silicon oxide (SiO$_2$) is considered. Here, the refractive index of silicon (Si) at the wavelength of 1.5 μm is defined as n1=3.37 and the refractive index of silicon oxide (SiO$_2$) is defined as n2=1.45. In this case, the difference in refractive index Δ between the core layer and the cladding layer to be an index of the intensity of the optical confinement is represented by the following expression.

$$\Delta=(n1^2-n2^2)/(2\times n1^2)\times 100\% \approx 40\%$$

Meanwhile, an example in which the core layer is made of silicon (Si) and the cladding layer is made of air is considered. Here, the refractive index of silicon (Si) at the wavelength of 1.5 μm is defined as n1=3.37 and the refractive index of air is defined as n2=1.00. In this case, the difference in refractive index Δ between the core layer and the cladding layer is represented by the following expression.

$$\Delta=(n1^2-n2^2)/(2\times n1^2)\times 100\% \approx 46\%$$

Accordingly, the optical confinement effect can be intensified when three surfaces such as both side surfaces and a lower surface of each of the semiconductor layers SL constituting the optical waveguide PO and the optical modulator PC are covered with air in comparison with the case where they are covered with silicon oxide (SiO$_2$).

Incidentally, when the insulating layer CL is not configured to have the hollow structure with a cavity, the semiconductor layers SL constituting the optical waveguide PO and the optical modulator PC are covered with silicon oxide (SiO$_2$) around the entire perimeter (in all directions). Therefore, the intervals between adjacent semiconductor layers SL, the interval between the semiconductor layer SL and the semiconductor substrate SUB and the interval between the semiconductor layer SL and the first-layer wiring M1 need to be about 2 to 3 μm in order to prevent the interference therebetween.

In particular, when the intervals between the adjacent semiconductor layers SL are narrowed, the lights propagating through the respective semiconductor layers SL interfere with each other and the propagation loss cannot be reduced. For example, when the wavelength of the light propagating through the semiconductor layer SL is 1.5 μm, the intervals between adjacent semiconductor layers SL cannot be reduced to less than 2 μm. This is one of the factors which prevents the high-density integration of the semiconductor device and restricts the size reduction of the semiconductor chip.

In addition, the cost of the SOI substrate can be reduced by reducing the thickness of the insulating layer CL constituting the SOI substrate. However, for the prevention of the interference between the semiconductor layer SL and the semiconductor substrate SUB, the interval between the semiconductor layer SL and the semiconductor substrate SUB, that is, the thickness of the insulating layer CL cannot be reduced to less than 2 μm. This is one of the factors which prevents the cost reduction of the semiconductor device.

However, in the first embodiment, three surfaces such as both side surfaces and a lower surface of each of the semiconductor layers SL constituting the optical waveguide PO and the optical modulator PC are covered with air, and thus the optical confinement effect can be intensified in comparison with the case where they are covered with silicon oxide ($SiO_2$). Accordingly, the intervals between the adjacent semiconductor layers SL and the interval between the semiconductor layer SL and the semiconductor substrate SUB can be reduced.

Since the intervals between the adjacent semiconductor layers SL can be reduced as described above, it is possible to achieve the high-density integration of the semiconductor device and the size reduction of the semiconductor chip. Further, since the interval between the semiconductor layer SL and the semiconductor substrate SUB, that is, the thickness of the insulating layer CL can be reduced to less than 2 μm, the cost of the SOI substrate can be reduced and the cost reduction of the semiconductor device can be achieved.

However, even when three surfaces such as both side surfaces and a lower surface of each of the semiconductor layers SL constituting the optical waveguide PO and the optical modulator PC are covered with air, a predetermined interval needs to be provided in order to prevent the interference between the adjacent semiconductor layers SL and the interference between the semiconductor layer SL and the semiconductor substrate SUB. Therefore, the interval between the adjacent semiconductor layers SL and the interval between the semiconductor layer SL and the semiconductor substrate SUB are desirably set to 1 μm or more and less than 2 μm.

In addition, in order to maintain the interval between the semiconductor layer SL and the semiconductor substrate SUB, a region in which no cavity is formed is present in the insulating layer CL. For example, this region is provided in the region where a dummy pattern PD made of the semiconductor layer SL is formed.

The pattern density of the optical signal transmission line section A and the optical modulation section B is generally low and is, for example, about 5%. Therefore, for example, when the optical waveguide PO and the optical modulator PC are formed by processing the semiconductor layer SL, the phenomenon in which the etching speed differs due to the pattern density (micro-loading effect) occurs. In order to suppress the phenomenon, the dummy pattern PD made of the semiconductor layer SL is disposed in the region where the optical waveguide PO and the optical modulator PC are not formed. Namely, the insulating film CL is present between the dummy pattern PD and the semiconductor substrate SUB.

<Manufacturing Method of Semiconductor Device>

A manufacturing method of a semiconductor device of the first embodiment will be described along with the process order with reference to FIG. 2 to FIG. 11. FIG. 2 to FIG. 4, FIG. 5A and FIG. 6 to FIG. 11 are cross-sectional views showing the principal part of a semiconductor device (for example, optical signal transmission line section A and optical modulation section B) in a manufacturing process of the first embodiment. FIG. 5B is a plan view showing the principal part of a semiconductor device (for example, optical signal transmission line section A) in the manufacturing process of the first embodiment.

Figure 2:
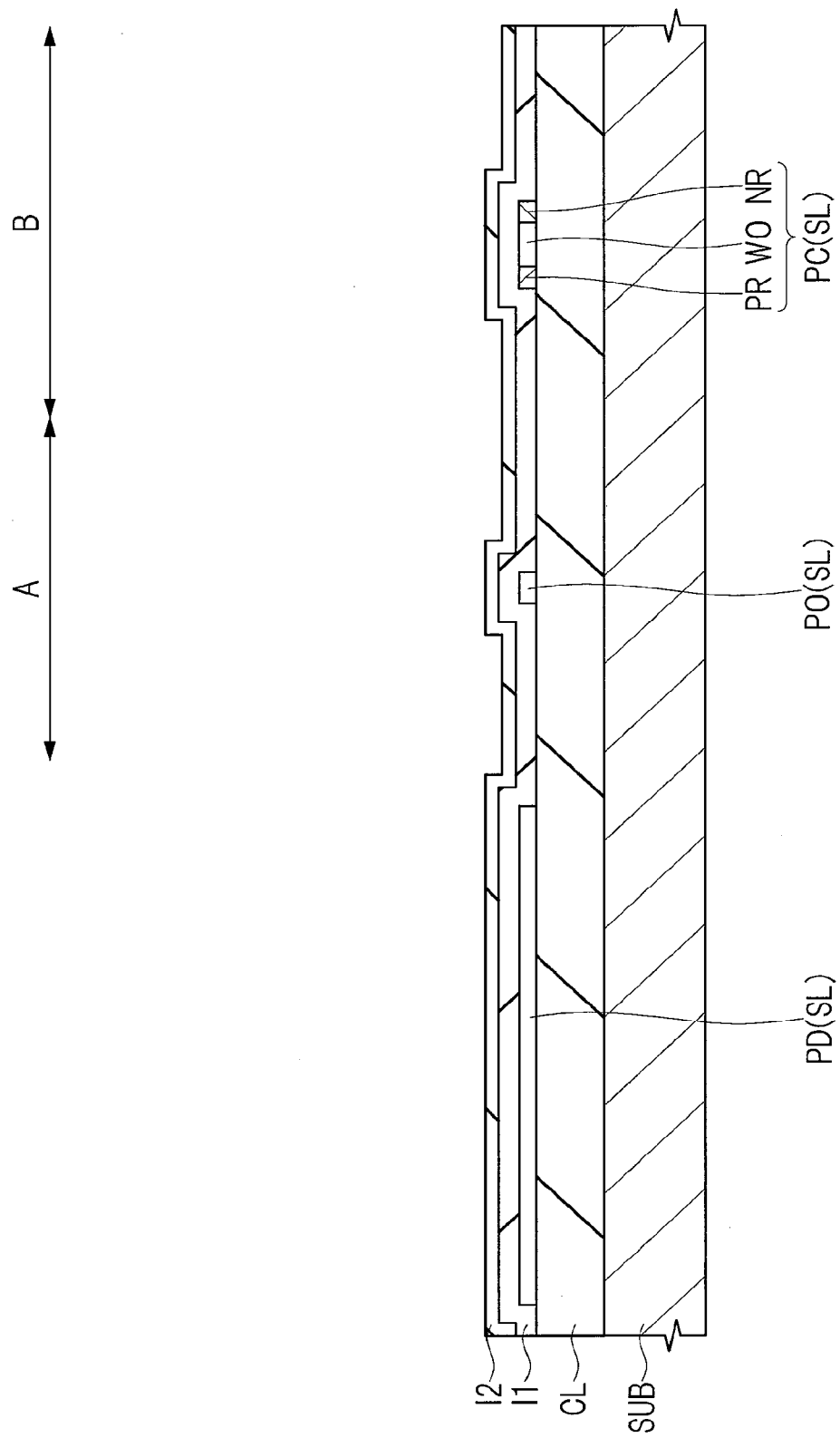
FIG. 2 is a cross-sectional view showing the principal part of a manufacturing process of a semiconductor device of the first embodiment.

First, as shown in FIG. 2, an SOI (Silicon On Insulator) substrate (circular substrate referred to as SOI wafer in this stage) made up of the semiconductor substrate SUB, the insulating layer CL formed on a main surface of the semiconductor substrate SUB and the semiconductor layer SL formed on an upper surface of the insulating layer CL is prepared.

The semiconductor substrate SUB is a support substrate made of single crystal silicon (Si), the insulating layer CL is made of silicon oxide ($SiO_2$) and the semiconductor layer SL is made of silicon (Si). The thickness of the semiconductor substrate SUB is, for example, about 750 μm. The thickness of the insulating layer CL is, for example, 1 μm or more and less than 2 μm. The thickness of the semiconductor layer SL is, for example, about 100 to 300 μm and preferably about 200 μm.

Next, the semiconductor layer SL is processed by dry etching using a resist mask, so that the semiconductor layer SL for the optical waveguide is formed in the optical signal transmission line section A and the semiconductor layer SL for the optical modulator is formed in the optical modulation section B. At this time, the semiconductor layer SL for dummy is also formed in order to suppress the microloading effect.

Next, a p type impurity is introduced to a part of the semiconductor layer SL for the optical modulator (part in which the p type semiconductor PR is to be formed), and an n type impurity is introduced to another part thereof (part in which the n type semiconductor NR is to be formed).

Through the process described above, the optical waveguide PO is formed in the optical signal transmission line section A. Also, the optical modulator PC having the pin structure including the optical waveguide WO, the p type semiconductor PR located on one side of the optical waveguide WO and the n type semiconductor NR located on the other side of the optical waveguide WO is formed in the optical modulation section B. Further, the dummy pattern PD having a rectangular shape with a side of about 30 to 50 μm when seen in a plan view is formed. Though not illustrated in FIG. 2, the dummy pattern PD is arranged around the optical waveguide PO formed in the optical signal transmission line section A and is arranged also around the optical modulator PC formed in the optical modulation section B.

Next, a first insulating film I1 and a second insulating film I2 are sequentially formed on an upper surface of the insulating layer CL so as to cover the optical waveguide PO, the optical modulator PC and the dummy pattern PD. The first insulating film I1 is made of, for example, silicon nitride ($Si_3N_4$) or silicon oxynitride (SiON) and the second insulating film I2 is made of, for example, silicon oxide ($SiO_2$). The first insulating film I1 is formed to have a thickness larger than that of the semiconductor layer SL and the total thickness of the first insulating film I1 and the second insulating film I2 is, for example, about 500 nm.

Figure 3:
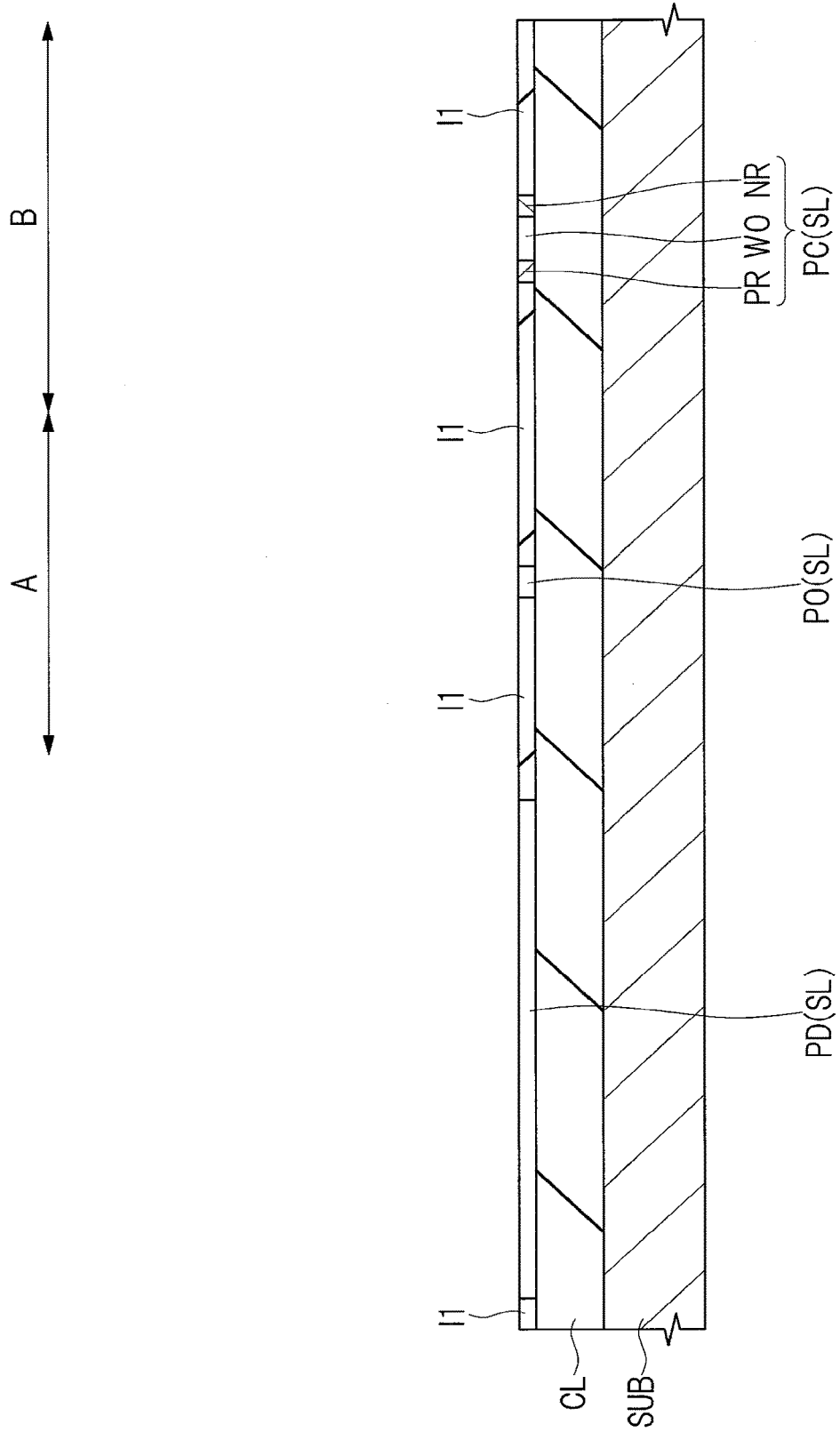
FIG. 3 is a cross-sectional view showing the principal part of the manufacturing process of a semiconductor device continued from FIG. 2.

Next, as shown in FIG. 3, an upper surface of the second insulating film I2 is planarized by, for example, CMP and then an upper surface of the first insulating film I1 is planarized by, for example, CMP until an upper surface of the semiconductor layer SL is exposed. Consequently, the spaces between the adjacent semiconductor layers SL are filled with the first insulating film I1.

Figure 4:
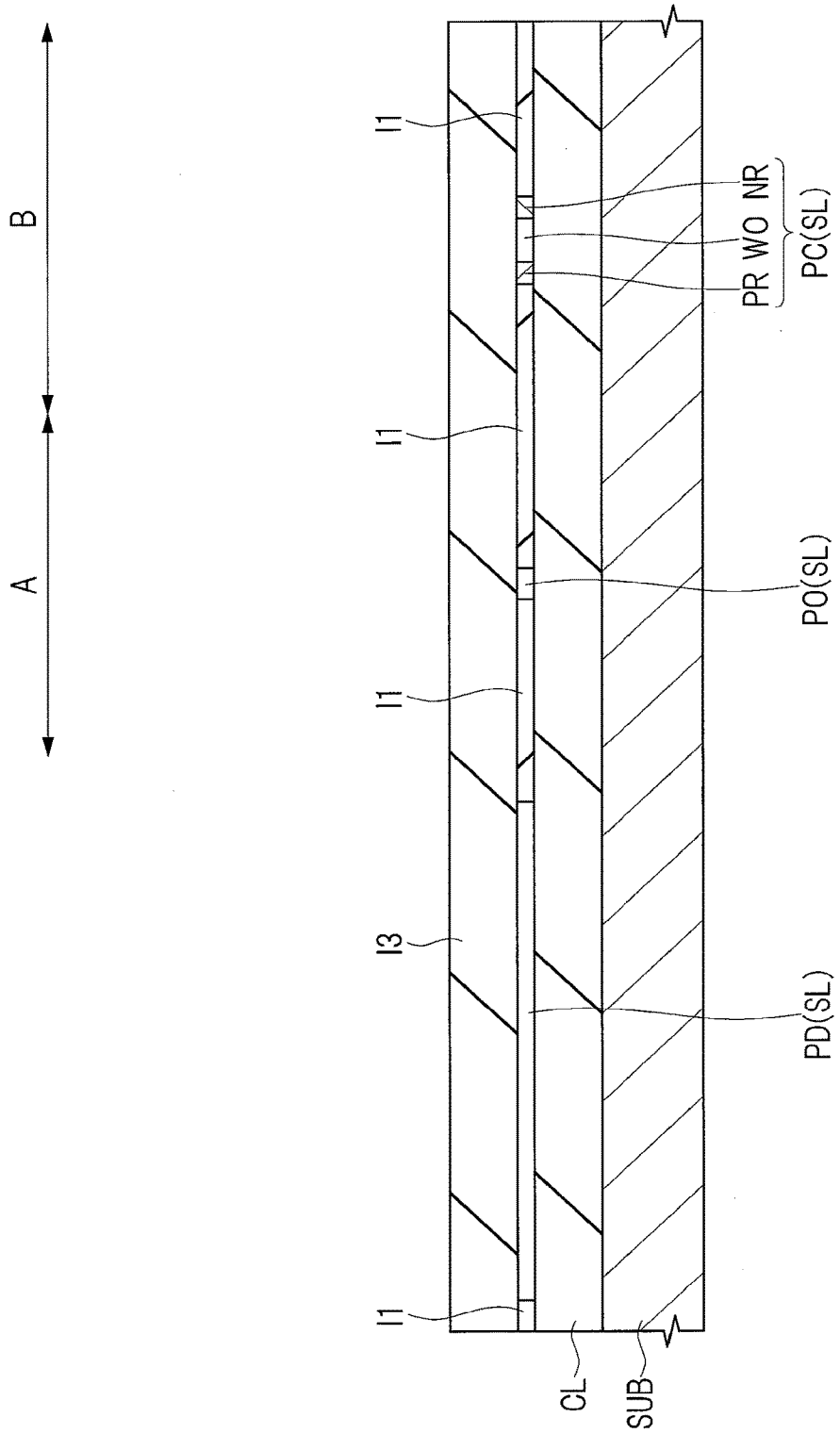
FIG. 4 is a cross-sectional view showing the principal part of the manufacturing process of a semiconductor device continued from FIG. 3.
Figure 5A:
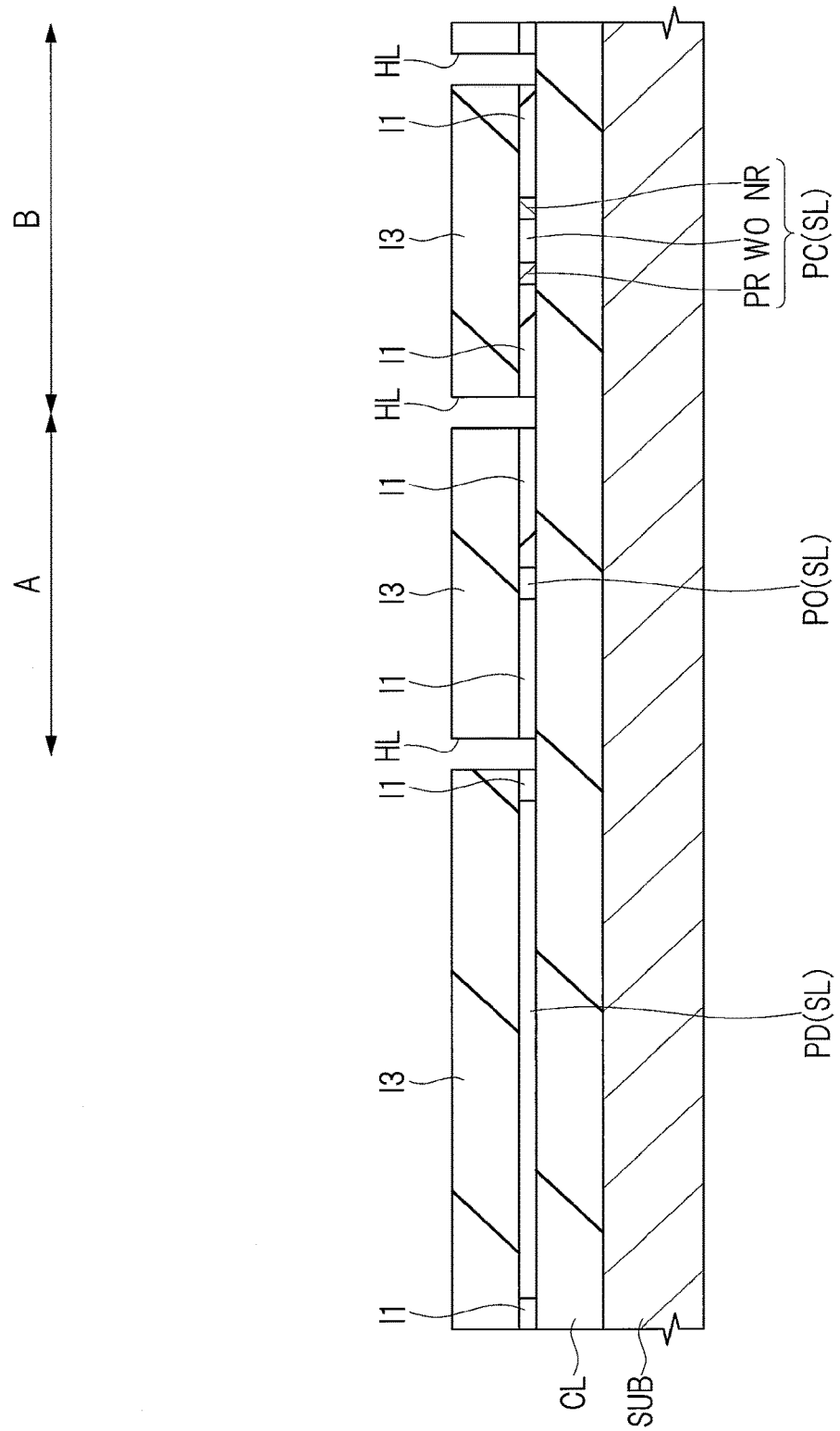
FIG. 5A is a cross-sectional view showing the principal part of the manufacturing process of a semiconductor device continued from FIG. 4.

Next, as shown in FIG. 4, a third insulating film I3 is formed on the upper surfaces of the semiconductor layer SL and the first insulating film I1. The third insulating film I3 is made of silicon oxide ($SiO_2$) formed by, for example, plasma CVD (Chemical Vapor Deposition) and a thickness thereof is, for example, about 1 µm.

Next, as shown in FIG. 5A and FIG. 5B, holes HL reaching the insulating layer CL are formed in the first insulating film I1 and the third insulating film I3. A diameter of each hole HL is, for example, about 0.5 µm. The holes HL are formed at positions distant from each of the optical waveguide PO and the optical modulator PC by, for example, about 5 µm when seen in a plan view.

Figure 6:
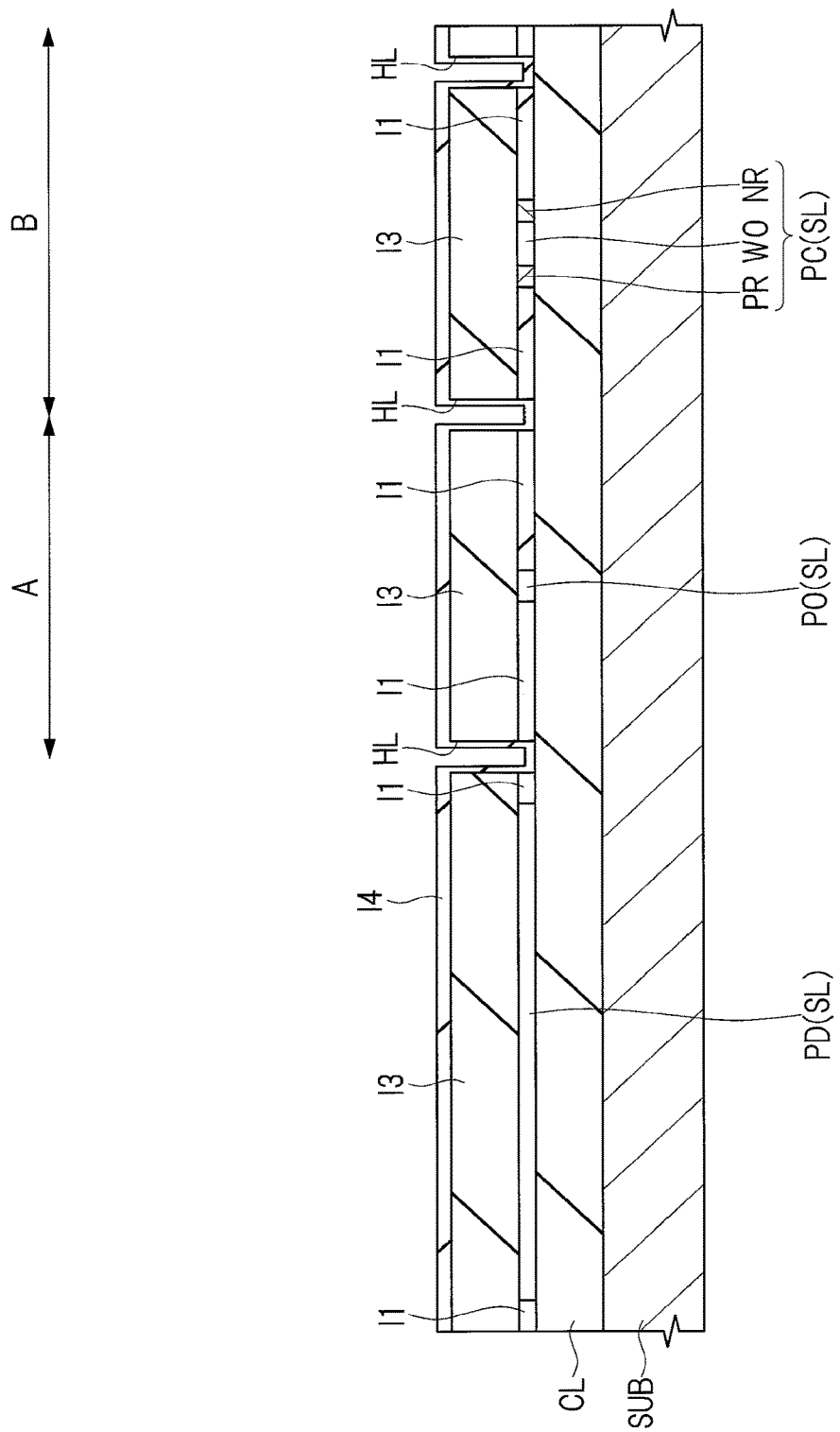
FIG. 6 is a cross-sectional view showing the principal part of the manufacturing process of a semiconductor device continued from FIG. 5.

Next, as shown in FIG. 6, a fourth insulating film I4 is formed on an upper surface of the third insulating film I3 with the inclusion of side surfaces and bottom surfaces of the holes HL. The fourth insulating film I4 is made of, for example, silicon nitride ($Si_3N_4$).

Figure 7:
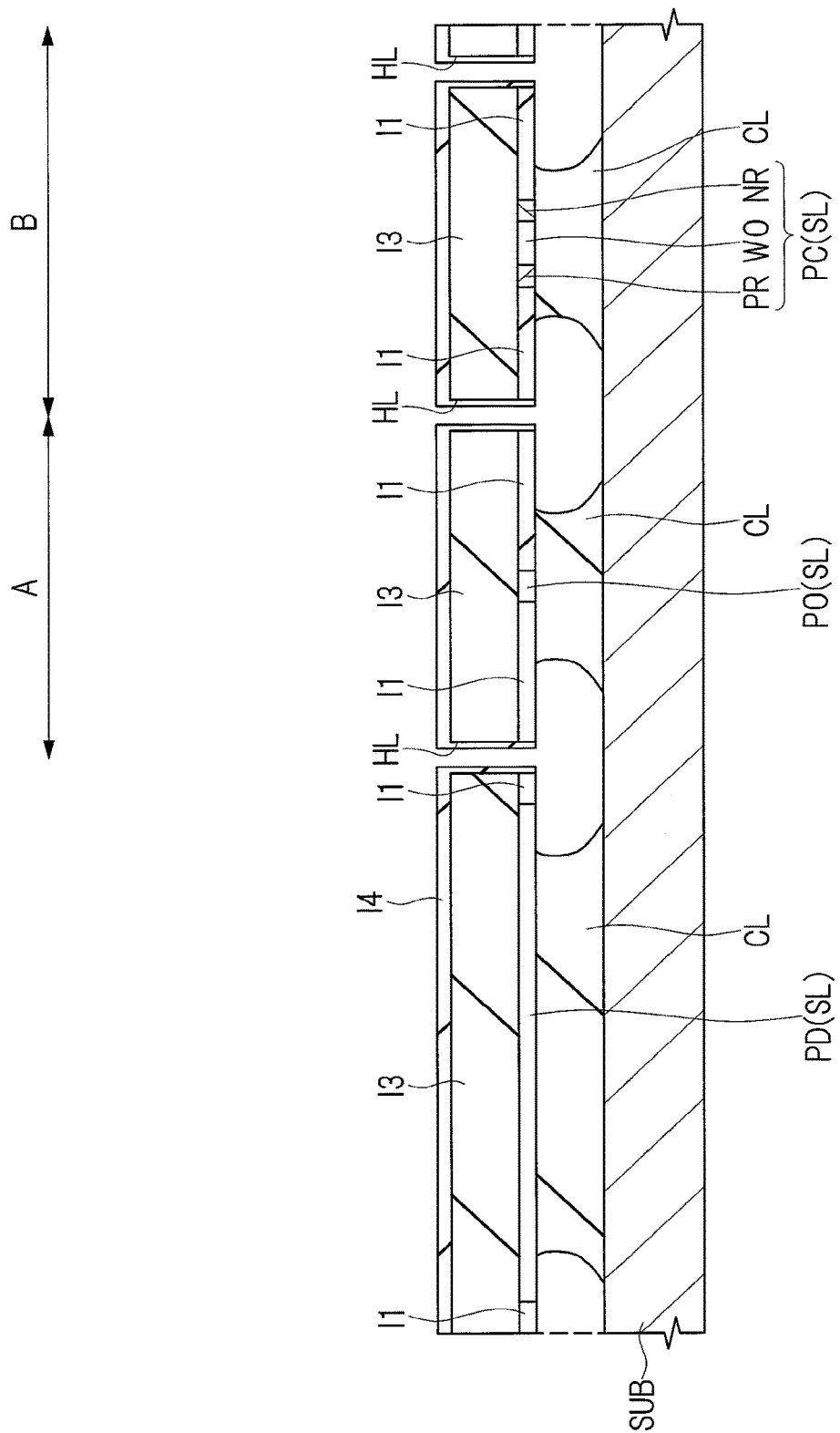
FIG. 7 is a cross-sectional view showing the principal part of the manufacturing process of a semiconductor device continued from FIG. 6.
Figure 8:
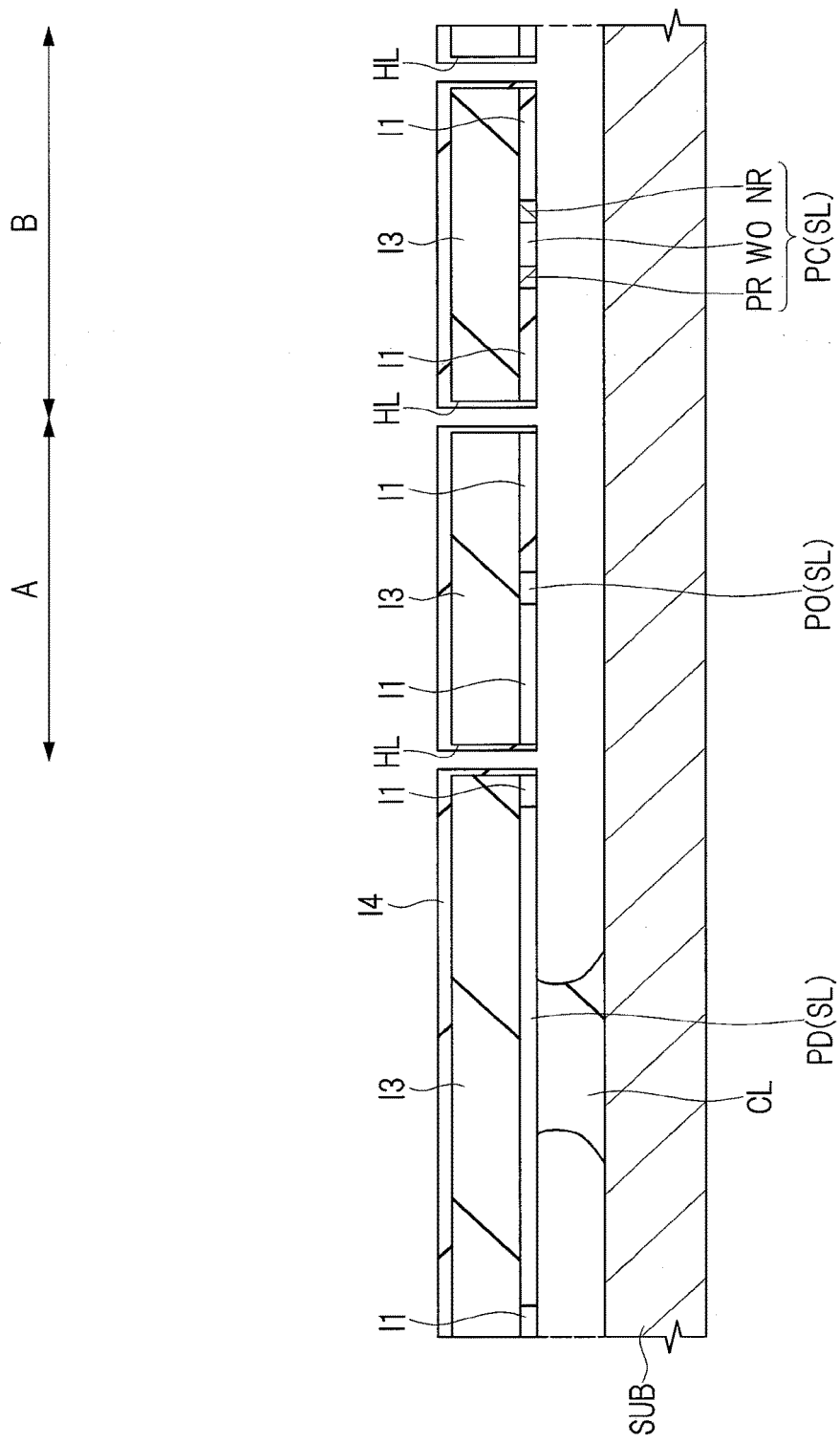
FIG. 8 is a cross-sectional view showing the principal part of the manufacturing process of a semiconductor device continued from FIG. 7.

Next, as shown in FIG. 7 and FIG. 8, the fourth insulating film I4 at the bottom surface of each hole HL is removed by, for example, dry etching, and then a part of the insulating layer CL is removed by, for example, wet etching. At this time, by supplying the etchant from the bottom surface of each hole HL, the insulating layer CL located below the optical waveguide PO and the optical modulator PC is removed and the insulating layer CL located below the dummy pattern PD is partially left.

For example, with respect to the optical waveguide PO formed at the position distant from the hole HL by about 5 µm, the lower surface of the optical waveguide PO is completely exposed when the etching of the insulating layer CL stating from the bottom surface of the hole HL proceeds by, for example, 10 µm. Similarly, with respect to the optical modulator PC formed at the position distant from the hole HL by about 5 µm, the lower surface of the optical modulator PC is completely exposed when the etching of the insulating layer CL stating from the bottom surface of the hole HL proceeds by, for example, 10 µm.

However, even when the etching starts from an end portion of the dummy pattern PD and the etching of the insulating layer CL proceeds by about 10 µm from the end portion of the dummy pattern PD, the lower surface of the dummy pattern PD is not completely exposed because one side of the dummy pattern PD is about 30 to 50 µm.

Consequently, the insulating layer CL is partially left to have the hollow structure with a cavity, so that the lower surfaces of the semiconductor layers SL constituting the optical waveguide PO and the optical modulator PC are exposed.

Figure 9:
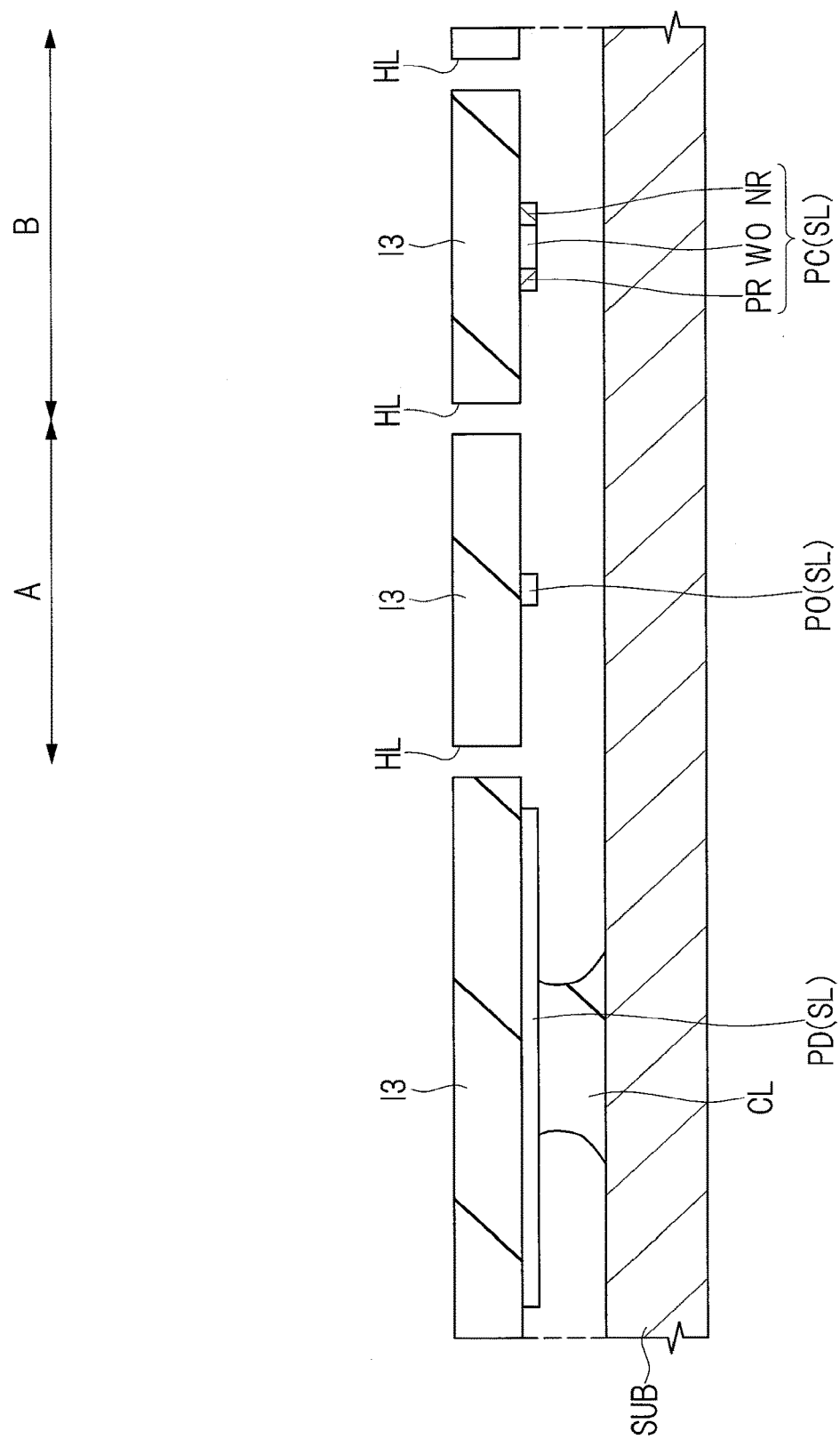
FIG. 9 is a cross-sectional view showing the principal part of the manufacturing process of a semiconductor device continued from FIG. 8.

Next, as shown in FIG. 9, the first insulating film I1 and the fourth insulating film I4 are removed by, for example, hot phosphoric acid. Consequently, the both side surfaces and the lower surfaces of the semiconductor layers SL constituting the optical waveguide PO and the optical modulator PC are exposed to air.

Figure 10:
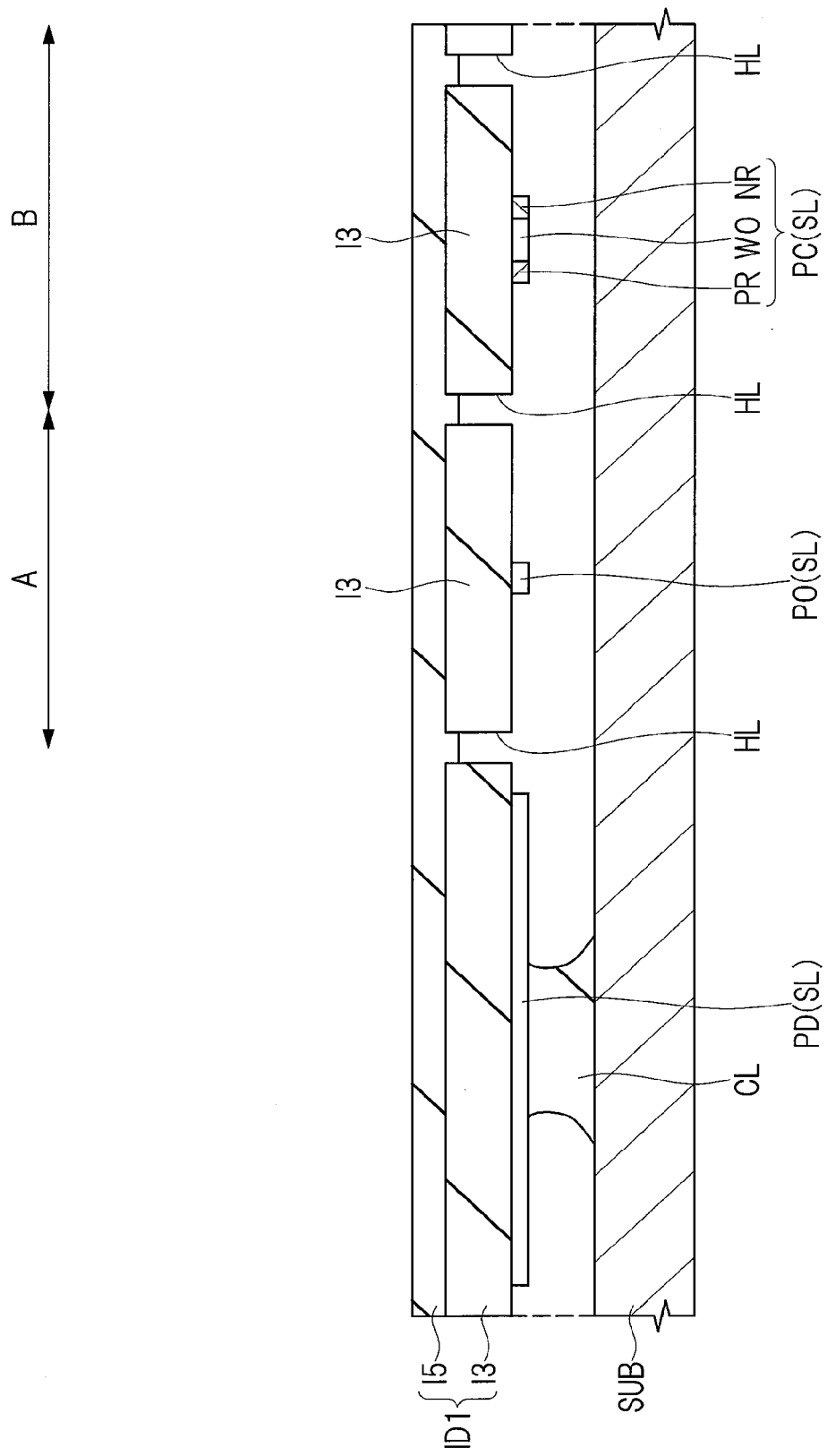
FIG. 10 is a cross-sectional view showing the principal part of the manufacturing process of a semiconductor device continued from FIG. 9.

Next, as shown in FIG. 10, a fifth insulating film I5 is formed on the upper surface of the third insulating film I3.

The fifth insulating film I5 is made of silicon oxide ($SiO_2$) formed by, for example, plasma CVD and a thickness thereof is, for example, about 500 nm. Subsequently, an upper surface of the fifth insulating film I5 is planarized by, for example, CMP, so that the first interlayer insulating film ID1 made up of the third insulating film I3 and the fifth insulating film I5 is formed.

Figure 11:
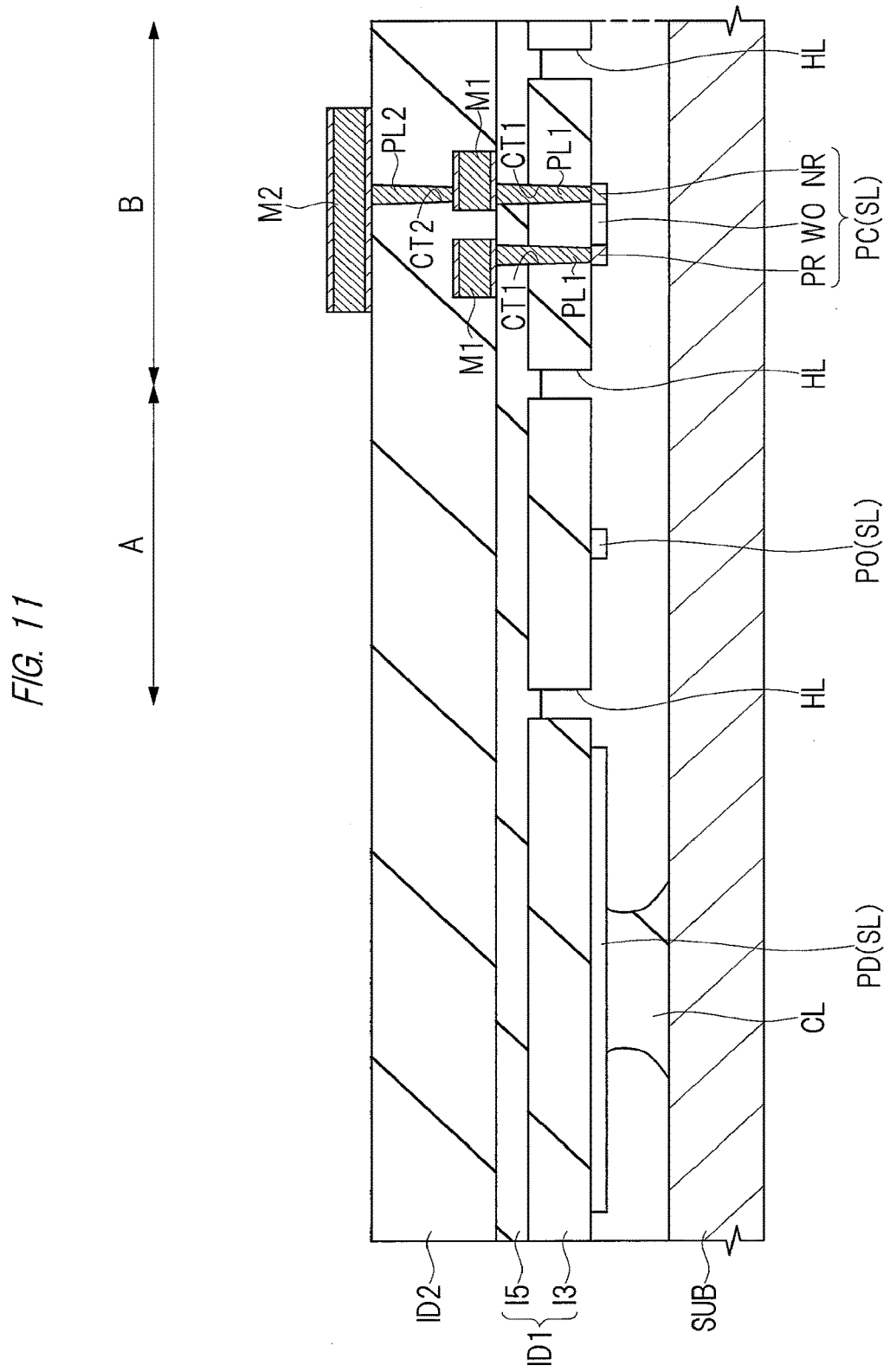
FIG. 11 is a cross-sectional view showing the principal part of the manufacturing process of a semiconductor device continued from FIG. 10.

Next, as shown in FIG. 11, the connection holes CT1 each reaching the p type semiconductor PR and the n type semiconductor NR of the optical modulator PC are formed in the first interlayer insulating film ID1. Subsequently, by filling the insides of the connection holes CT1 with a conductive film, the first plugs PL1 made of the buried conductive film are formed. The first plug PL1 is made of, for example, aluminum (Al) or tungsten (W).

Next, a metal film, for example, an aluminum (Al) film is deposited on an upper surface of the first interlayer insulating film ID1 by, for example, sputtering and the metal film is processed by dry etching using a resist mask, thereby forming the first-layer wiring M1.

Next, the second interlayer insulating film ID2 is formed on the upper surface of the first interlayer insulating film ID1 so as to cover the first-layer wiring M1. The second interlayer insulating film ID2 is made of silicon oxide ($SiO_2$) formed by, for example, plasma CVD and a thickness thereof is, for example, 1 µm or more.

Next, an upper surface of the second interlayer insulating film ID2 is planarized by, for example, CMP and then the connection hole CT2 reaching the first-layer wiring M1 is formed in the second interlayer insulating film ID2. Subsequently, by filling the inside of the connection hole CT2 with a conductive film, the second plug PL2 made of the buried conductive film is formed. The second plug PL2 is made of, for example, aluminum (Al) or tungsten (W).

Next, a metal film, for example, an aluminum (Al) film is deposited on an upper surface of the second interlayer insulating film ID2 by, for example, sputtering and the metal film is processed by dry etching using a resist mask, thereby forming the second-layer wiring M2.

Thereafter, as shown in FIG. 1, the protection film TC is formed so as to cover the second-layer wiring M2 and then the protection film TC is processed to expose an upper surface of the second-layer wiring M2. Consequently, the semiconductor device of the first embodiment is almost completed.

Note that the cavity is formed in the insulating layer CL and the cavity contains air in the first embodiment. Alternatively, an insulating material with a refractive index lower than that of silicon oxide ($SiO_2$) may be injected into the cavity.

Furthermore, in order to compensate for the deficiency in mechanical strength of the SOI substrate, instead of completely removing the insulating layer CL between the optical waveguide PO and the semiconductor substrate SUB and between the optical modulator PC and the semiconductor substrate SUB, the insulating layer CL may be provided at a part between the optical waveguide PO and the semiconductor substrate SUB and a part between the optical modulator PC and the semiconductor substrate SUB at the position which gives no influence to the optical characteristics.

As described above, since the intervals between the adjacent semiconductor layers SL can be reduced to less than 2 µm in the first embodiment, it is possible to achieve the high-density integration of the semiconductor device and the size reduction of the semiconductor chip. Further, since the interval between the semiconductor layer SL and the semiconductor substrate SUB, that is, the thickness of the insulating layer CL can be reduced to less than 2 μm, the cost of the SOI substrate can be reduced and the cost reduction of the semiconductor device can be achieved.

Second Embodiment

The second embodiment is different from the first embodiment in the shape of the cavity which covers the semiconductor layer SL. Namely, three surfaces such as both side surfaces and a lower surface of each of the semiconductor layers SL constituting the optical waveguide PO and the optical modulator PC are covered with air in the first embodiment, while only both side surfaces of each of the semiconductor layers SL constituting the optical waveguide PO and the optical modulator PC are covered with air and lower surfaces thereof are covered with the insulating layer CL in the second embodiment.

Since the semiconductor device of the second embodiment is almost the same as the semiconductor device of the first embodiment described above except for the structure of the cavity and the forming method of the cavity, the difference therebetween will be mainly described below.

<Structure of Semiconductor Device>

Figure 12:
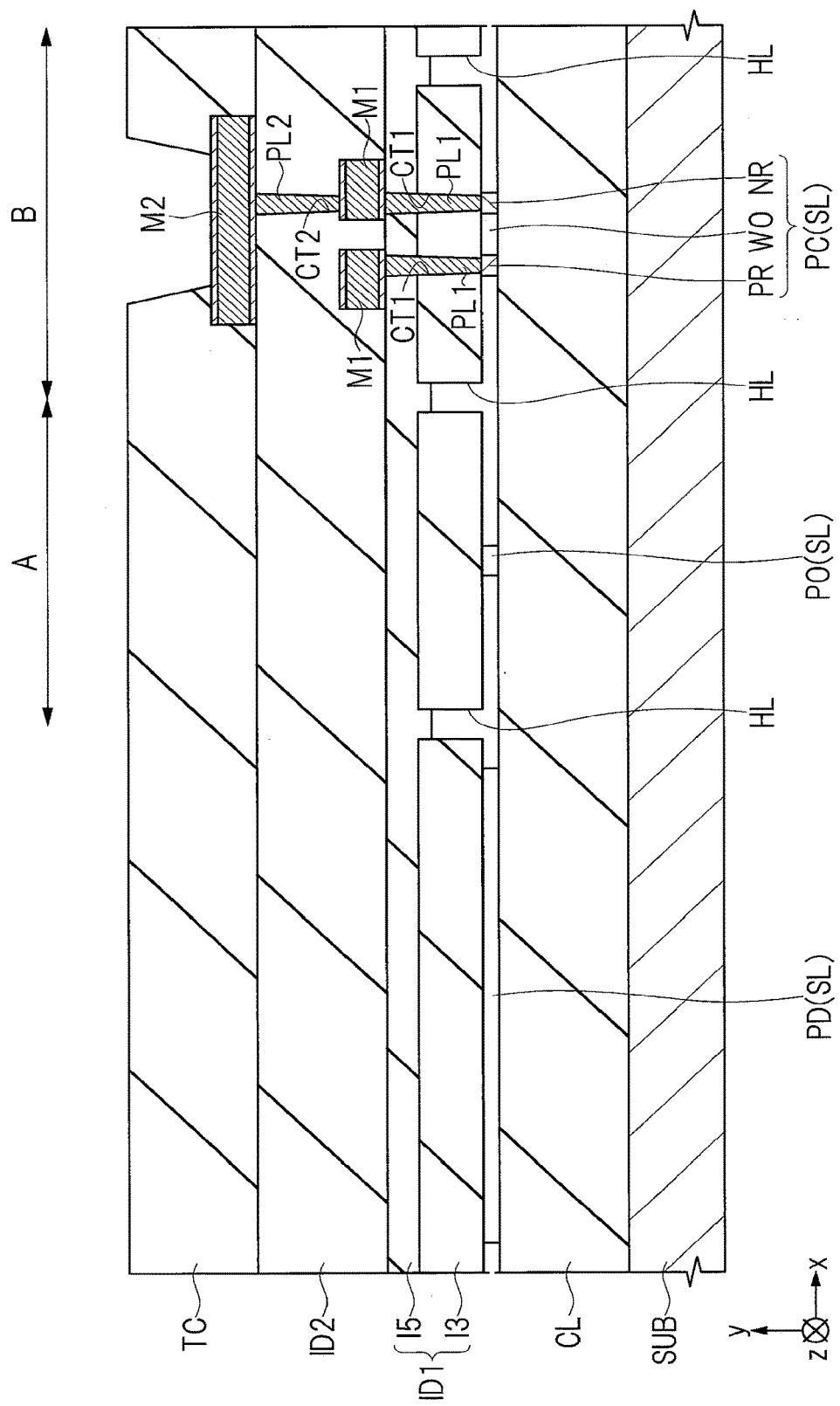
FIG. 12 is a cross-sectional view showing the principal part of a semiconductor device of the second embodiment.

A structure of the semiconductor device of the second embodiment will be described with reference to FIG. 12. FIG. 12 is a cross-sectional view showing the principal part of the semiconductor device of the second embodiment.

As shown in FIG. 12, like in the first embodiment described above, the SOI substrate made up of the semiconductor substrate SUB, the insulating layer CL formed on a main surface of the semiconductor substrate SUB and the semiconductor layer SL formed on an upper surface of the insulating layer CL is used in the semiconductor device, and the semiconductor layer SL constitutes each of the optical waveguide PO in the optical signal transmission line section A and the optical modulator PC in the optical modulation section B.

Unlike the first embodiment described above, however, the cavity is not formed in the insulating layer CL and only both side surfaces of the semiconductor layers SL constituting the optical waveguide PO and the optical modulator PC are covered with air, and lower surfaces thereof are covered with the insulating layer CL made of, for example, silicon oxide ($SiO_2$). In order to prevent the interference between the semiconductor layers SL constituting the optical waveguide PO and the optical modulator PC and the semiconductor substrate SUB, the interval between the semiconductor layers SL and the semiconductor substrate SUB, that is, the thickness of the insulating layer CL is set to, for example, about 2 to 3 μm.

In the second embodiment, the insulating layer CL is not configured to have the hollow structure with a cavity and thus the interval between the semiconductor layer SL and the semiconductor substrate SUB, that is, the thickness of the insulating layer CL cannot be reduced to less than 2 μm. However, since the both side surfaces of the semiconductor layers SL constituting the optical waveguide PO and the optical modulator PC are covered with air, the optical confinement effect can be intensified in comparison with the case where the both side surfaces are covered with silicon oxide ($SiO_2$), so that the intervals between the adjacent semiconductor layers SL can be reduced to less than 2 μm.

As described above, since the intervals between the adjacent semiconductor layers SL can be reduced to less than 2 μm, it is possible to achieve the high-density integration of the semiconductor device and the size reduction of the semiconductor chip.

<Manufacturing Method of Semiconductor Device>

A manufacturing method of a semiconductor device of the second embodiment will be described along with the process order with reference to FIG. 13 to FIG. 16. FIG. 13 to FIG. 16 are cross-sectional views showing the principal part of a semiconductor device in a manufacturing process of the second embodiment.

Figure 13:
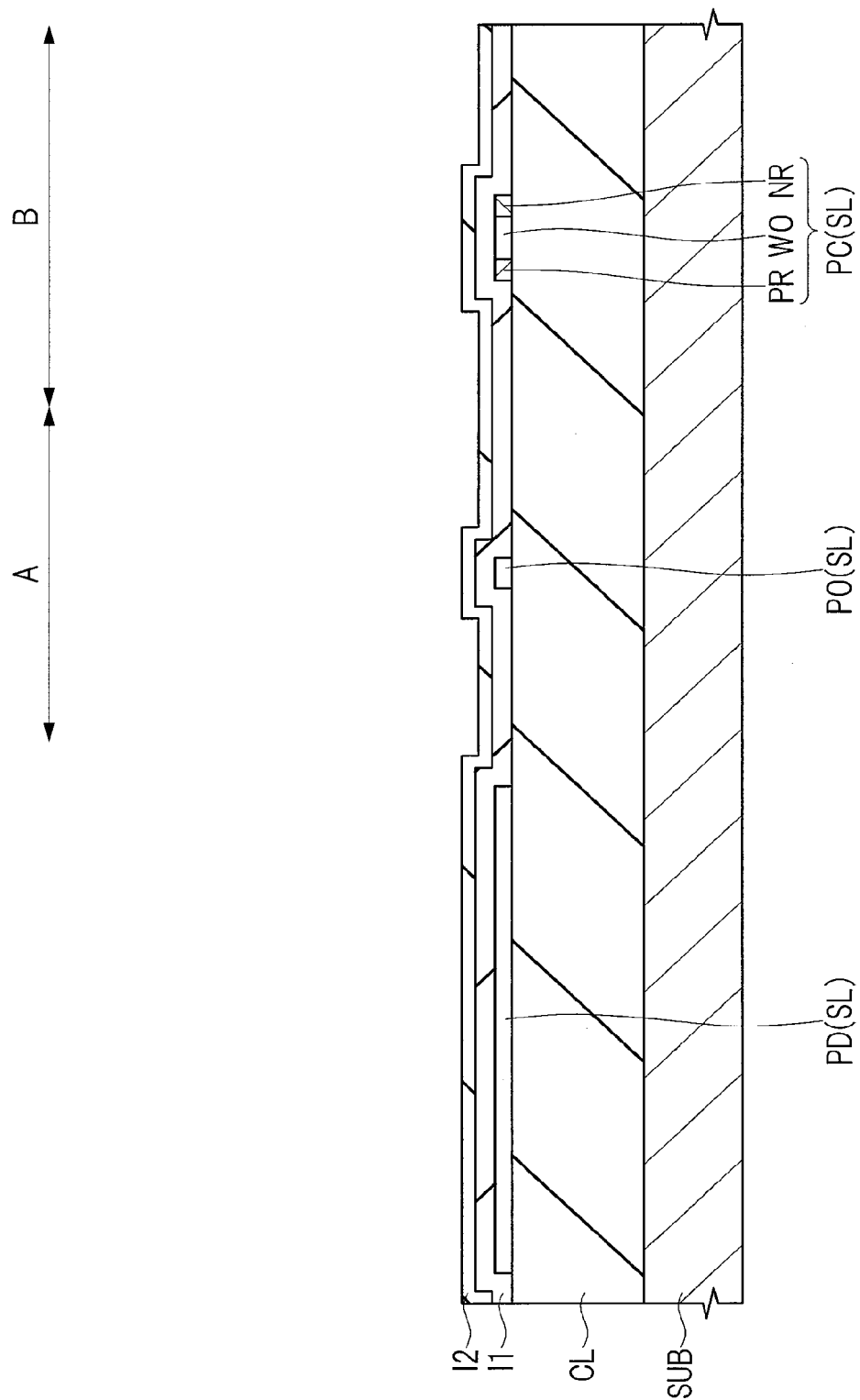
FIG. 13 is a cross-sectional view showing the principal part of a manufacturing process of a semiconductor device of the second embodiment.

As shown in FIG. 13, in the same manner as the first embodiment described above, the 501 substrate is prepared and the semiconductor layer SL constituting the SOI substrate is processed to form the optical waveguide PO in the optical signal transmission line section A and the optical modulator PC with the pin structure in the optical modulation section B. Further, the dummy patterns PD are formed around them. However, the insulating layer CL constituting the SOI substrate has the thickness of, for example, about 2 to 3 μm and is formed to be thicker than the insulating layer CL of the first embodiment described above.

Next, the first insulating film I1 and the second insulating film I2 are sequentially formed on the upper surface of the insulating layer CL so as to cover the optical waveguide PO, the optical modulator PC and the dummy pattern PD. The first insulating film I1 is made of, for example, silicon nitride ($Si_3N_4$) or silicon oxynitride (SiON) and the second insulating film I2 is made of, for example, silicon oxide ($SiO_2$).

Figure 14:
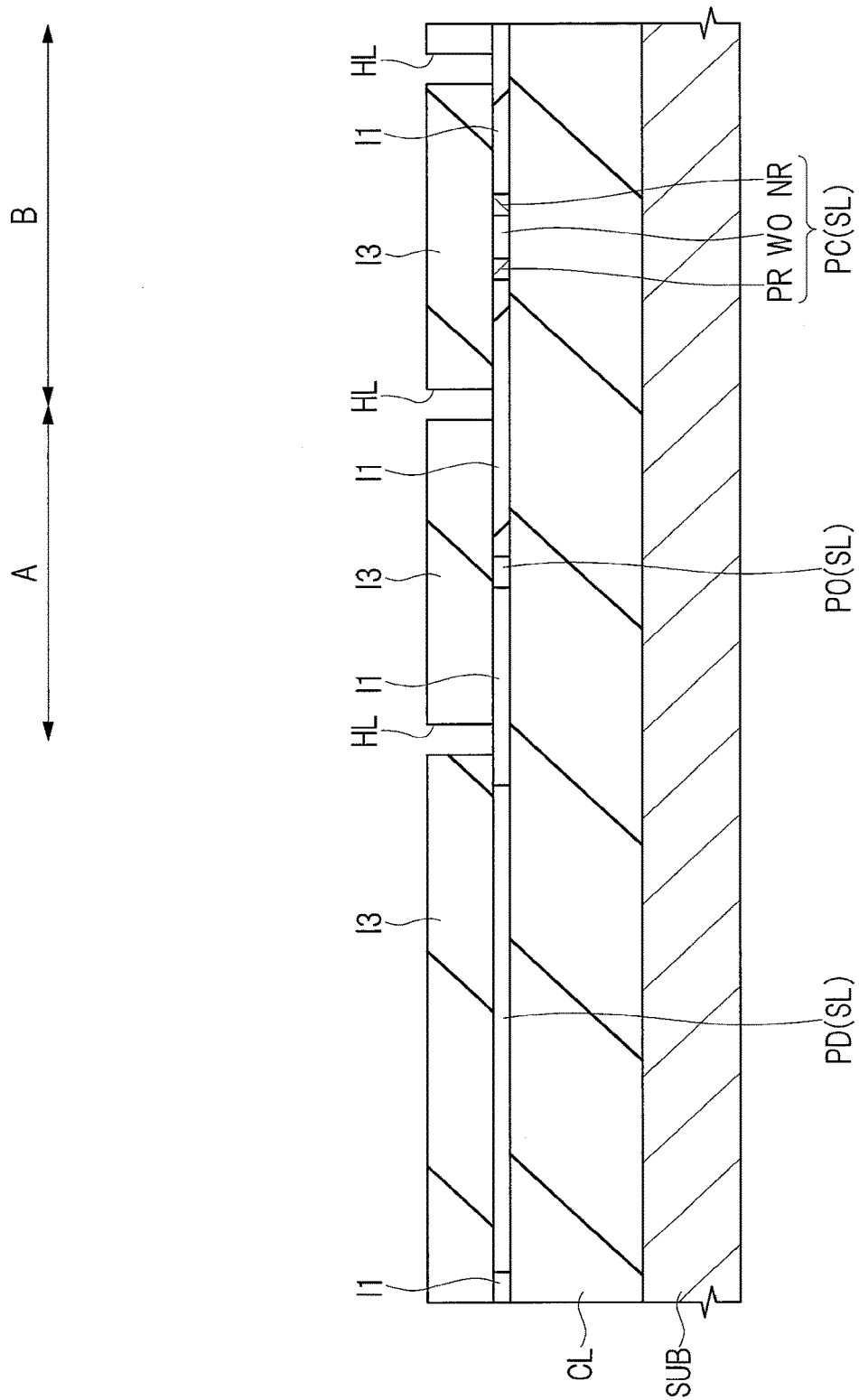
FIG. 14 is a cross-sectional view showing the principal part of the manufacturing process of a semiconductor device continued from FIG. 13.

Next, as shown in FIG. 14, the upper surface of the second insulating film I2 is planarized by, for example, CMP and then the upper surface of the first insulating film I1 is planarized by, for example, CMP until the upper surface of the semiconductor layer SL is exposed. Consequently, the spaces between the adjacent semiconductor layers SL are filled with the first insulating film I1.

Next, the third insulating film I3 is formed on the upper surfaces of the semiconductor layer SL and the first insulating film I1. The third insulating film I3 is made of silicon oxide ($SiO_2$) formed by, for example, plasma CVD and the thickness thereof is, for example, about 1 μm.

Next, the holes HL reaching the first insulating film I1 are formed in the third insulating film I3. The diameter of each hole HL is, for example, about 0.5 μm. The holes HL are formed at positions distant from each of the optical waveguide PO and the optical modulator PC by, for example, about 5 μm when seen in a plan view.

Figure 15:
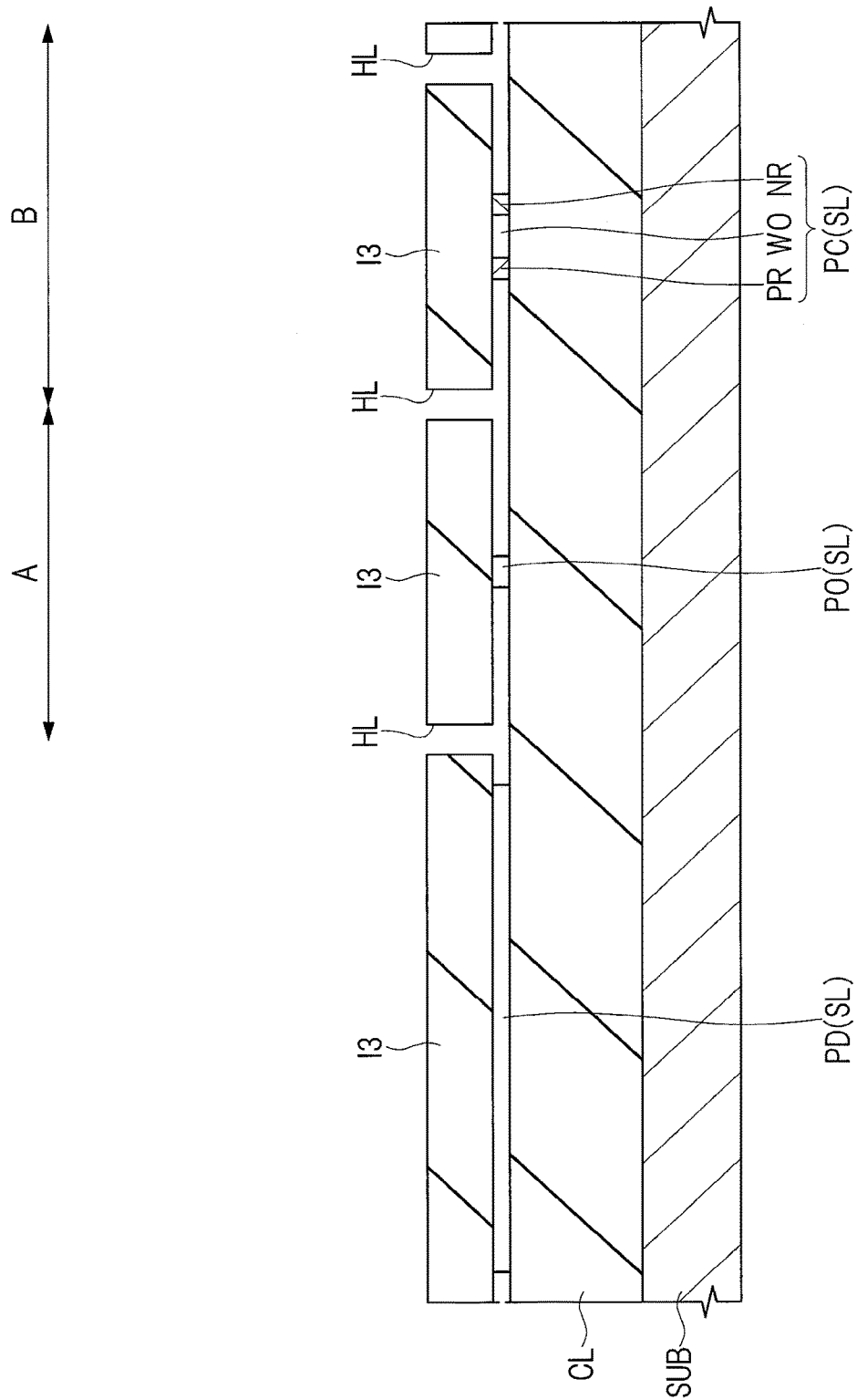
FIG. 15 is a cross-sectional view showing the principal part of the manufacturing process of a semiconductor device continued from FIG. 14.

Next, as shown in FIG. 15, the first insulating film I1 is removed by, for example, wet etching. At this time, by supplying the etchant from the bottom surface of each hole HL, the first insulating film I1 is removed.

Figure 16:
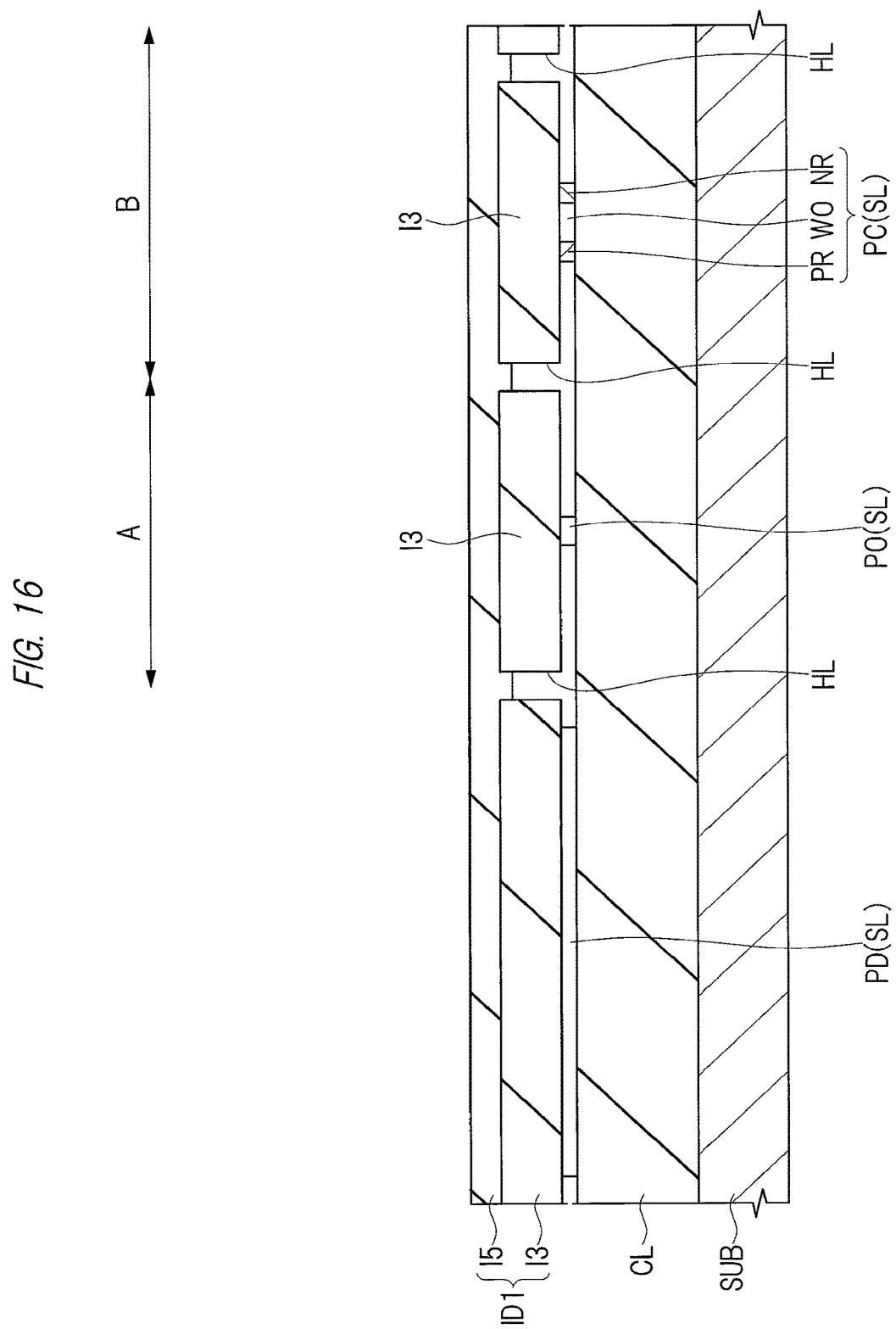
FIG. 16 is a cross-sectional view showing the principal part of the manufacturing process of a semiconductor device continued from FIG. 15.

Next, as shown in FIG. 16, the fifth insulating film I5 is formed on the upper surface of the third insulating film I3. The fifth insulating film I5 is made of silicon oxide ($SiO_2$) formed by, for example, plasma CVD and the thickness thereof is, for example, about 500 nm. Subsequently, the upper surface of the fifth insulating film I5 is planarized by, for example, CMP, so that the first interlayer insulating film ID1 made up of the third insulating film I3 and the fifth insulating film I5 is formed.

Next, in the same manner as the first embodiment, as shown in FIG. 12, the first plugs PL1 are formed in the first-layer insulating film ID1 and the first-layer wiring M1 electrically connected to the first plug PL1 is formed. Further, after the second interlayer insulating film ID2 is formed so as to cover the first-layer wiring M1, the second plug PL2 is formed in the second interlayer insulating film ID2 and the second-layer wiring M2 electrically connected to the second plug PL2 is formed.

Thereafter, the protection film TC is formed so as to cover the second-layer wiring M2 and is then processed to expose the upper surface of the second-layer wiring M2. Consequently, the semiconductor device of the second embodiment is almost completed.

As described above, in the second embodiment, since the intervals between the adjacent semiconductor layers SL can be reduced to less than 2 μm, it is possible to achieve the high-density integration of the semiconductor device and the size reduction of the semiconductor chip.

Third Embodiment

The third embodiment is different from the first embodiment in the shape of the cavity which covers the semiconductor layer SL. Namely, three surfaces such as both side surfaces and a lower surface of each of the semiconductor layers SL constituting the optical waveguide PO and the optical modulator PC are covered with air in the first embodiment, while three surfaces such as both side surfaces and an upper surface (surface facing toward a side opposite to the semiconductor substrate SUB) of each of the semiconductor layers SL constituting the optical waveguide PO and the optical modulator PC are covered with air in the third embodiment.

Since the semiconductor device of the third embodiment is almost the same as the semiconductor device of the first embodiment described above except for the structure of the cavity and the forming method of the cavity, the difference therebetween will be mainly described below.

<Structure of Semiconductor Device>

Figure 17:
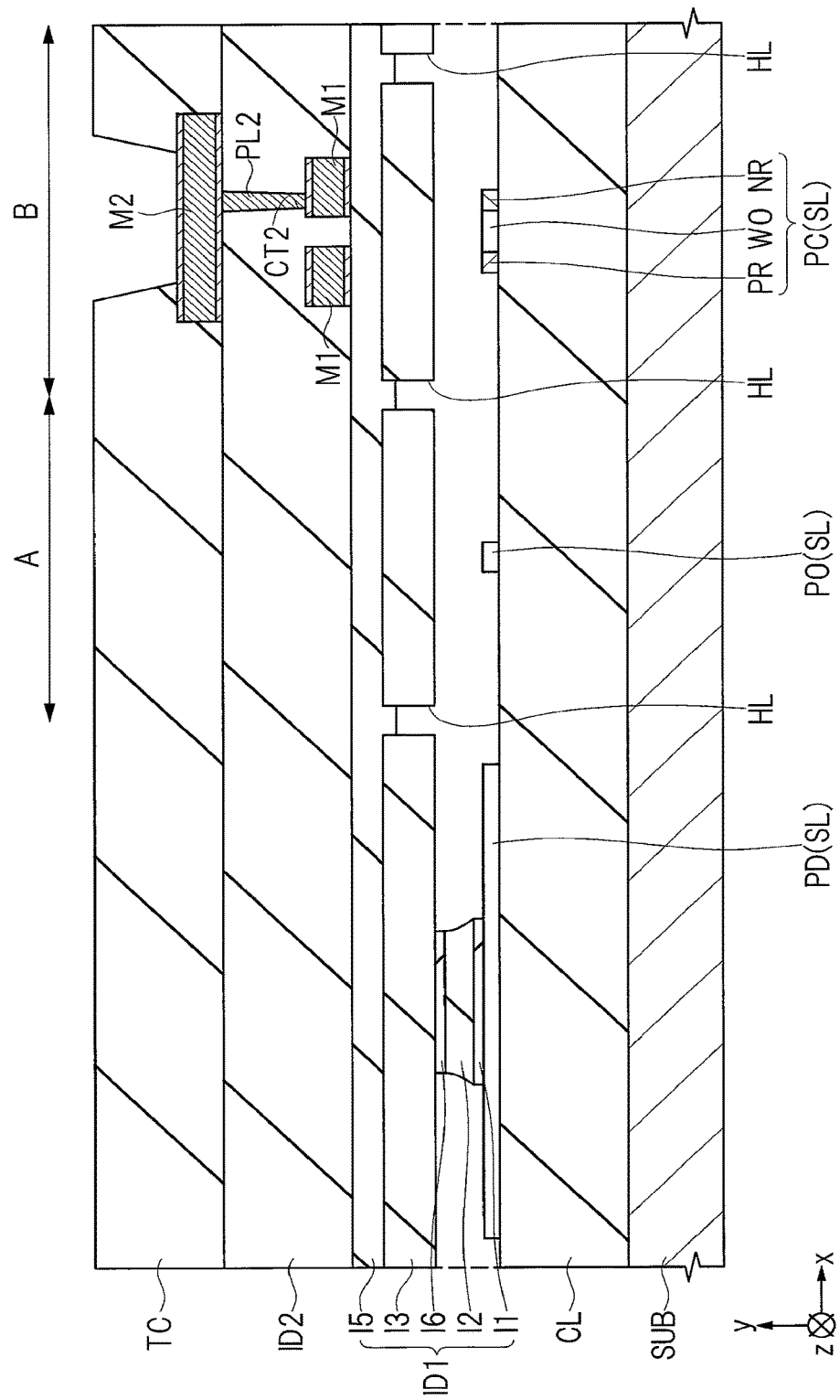
FIG. 17 is a cross-sectional view showing the principal part of a semiconductor device of the third embodiment.

A structure of the semiconductor device of the third embodiment will be described with reference to FIG. 17. FIG. 17 is a cross-sectional view showing the principal part of the semiconductor device of the third embodiment.

As shown in FIG. 17, like in the first embodiment described above, the SOI substrate made up of the semiconductor substrate SUB, the insulating layer CL formed on a main surface of the semiconductor substrate SUB and the semiconductor layer SL formed on an upper surface of the insulating layer CL is used in the semiconductor device, and the semiconductor layer SL constitutes each of the optical waveguide PO in the optical signal transmission line section A and the optical modulator PC in the optical modulation section B.

Unlike the first embodiment described above, however, the cavity is not formed in the insulating layer CL and the cavity is formed in the first-layer insulating film ID1. Namely, the first interlayer insulating film ID1 is removed except for a part thereof to have a hollow structure with a cavity. Therefore, the both side surfaces and the upper surface of each of the semiconductor layers SL constituting the optical waveguide PO and the optical modulator PC are exposed.

The lower surfaces of the semiconductor layers SL constituting the optical waveguide PO and the optical modulator PC are covered with the insulating layer CL made of, for example, silicon oxide (SiO$_2$). In order to prevent the interference between the semiconductor layers SL constituting the optical waveguide PO and the optical modulator PC and the semiconductor substrate SUB, the interval between the semiconductor layers SL and the semiconductor substrate SUB, that is, the thickness of the insulating layer CL is set to, for example, about 2 to 3 μm.

In the third embodiment, the insulating layer CL is not configured to have the hollow structure with a cavity and thus the interval between the semiconductor layer SL and the semiconductor substrate SUB, that is, the thickness of the insulating layer CL cannot be reduced to less than 2 μm.

However, since the both side surfaces and the upper surfaces of the semiconductor layers SL constituting the optical waveguide PO and the optical modulator PC are covered with air, the optical confinement effect can be intensified in comparison with the case where the both side surfaces and the upper surfaces are covered with silicon oxide (SiO$_2$), so that the intervals between the adjacent semiconductor layers SL can be reduced to less than 2 μm.

As described above, since the intervals between the adjacent semiconductor layers SL can be reduced to less than 2 μm, it is possible to achieve the high-density integration of the semiconductor device and the size reduction of the semiconductor chip.

In order to maintain the cavity formed in the first interlayer insulating film ID1, a region in which no cavity is formed is present in the first interlayer insulating film ID1. For example, this region is provided in the region where the dummy pattern PD made of the semiconductor layer SL is formed like in the first embodiment described above.

Though not illustrated, the cavity is not formed in the first interlayer insulating film ID1 also in the region where the first plugs PL1 which electrically connect the p type semiconductor PR of the optical modulator PC and the first-layer wiring M1 and connect the n type semiconductor NR and the first-layer wiring M1 are formed. This region also maintains the cavity formed in the first interlayer insulating film ID1.

<Manufacturing Method of Semiconductor Device>

A manufacturing method of a semiconductor device of the third embodiment will be described along with the process order with reference to FIG. 18 to FIG. 23. FIG. 18 to FIG. 23 are cross-sectional views showing the principal part of a semiconductor device in a manufacturing process of the third embodiment.

Figure 18:
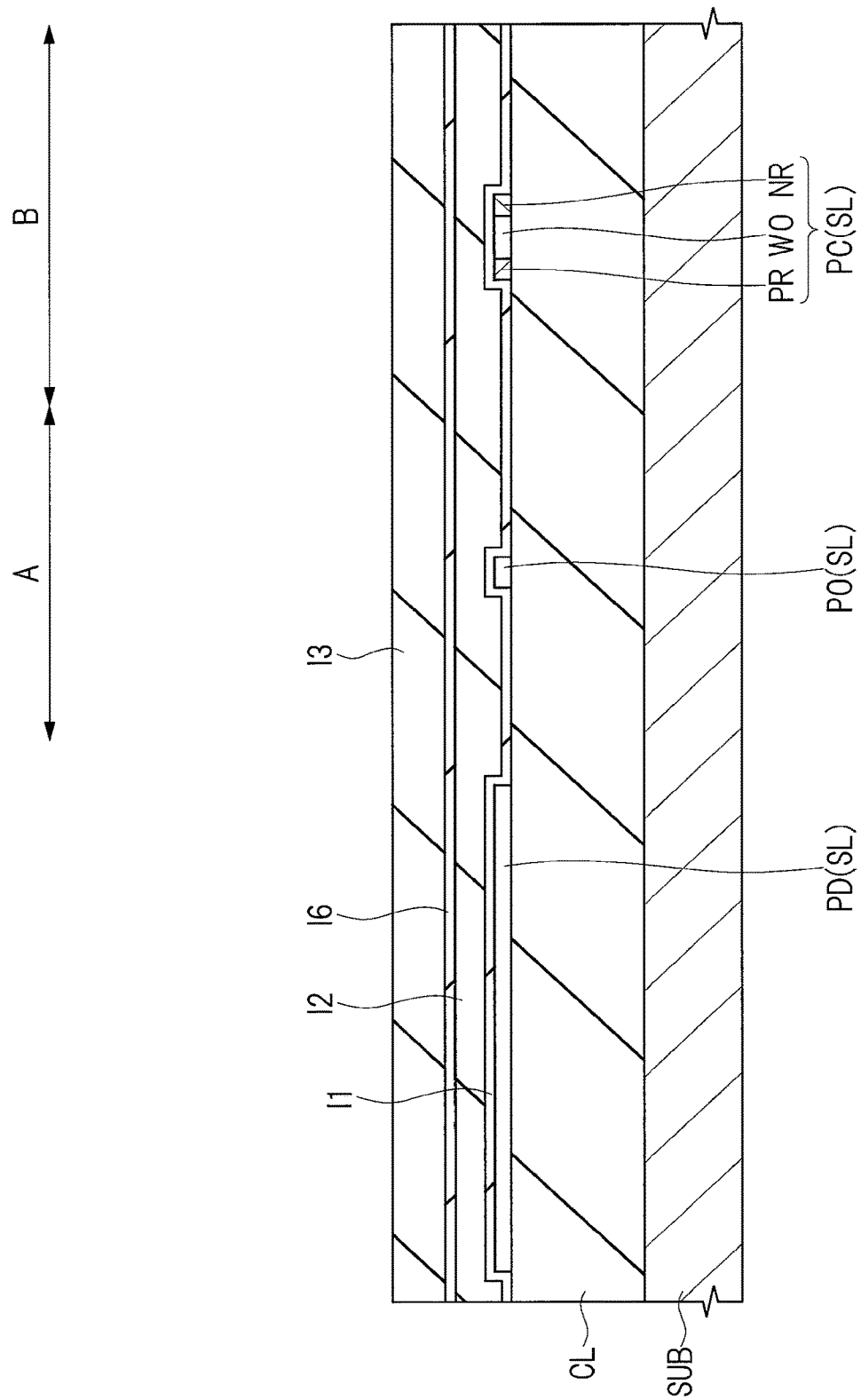
FIG. 18 is a cross-sectional view showing the principal part of a manufacturing process of a semiconductor device of the third embodiment.

As shown in FIG. 18, in the same manner as the first embodiment described above, the SOI substrate is prepared and the semiconductor layer SL constituting the SOI substrate is processed to form the optical waveguide PO in the optical signal transmission line section A and the optical modulator PC with the pin structure in the optical modulation section B. Further, the dummy patterns PD are formed around them. However, the insulating layer CL constituting the SOI substrate has the thickness of, for example, about 2 to 3 μm and is formed to be thicker than the insulating layer CL of the first embodiment described above.

Next, the first insulating film I1 and the second insulating film I2 are sequentially formed on the main surface of the insulating layer CL so as to cover the optical waveguide PO, the optical modulator PC and the dummy pattern PD. The first insulating film I1 is made of, for example, silicon nitride (Si$_3$N$_4$) or silicon oxynitride (SiON) and the thickness thereof is, for example, about 50 to 100 nm. The second insulating film I2 is made of, for example, silicon oxide (SiO$_2$) and the thickness thereof is, for example, about 1 μm.

Next, after the upper surface of the second insulating film I2 is planarized by, for example, CMP, a sixth insulating film I6 and the third insulating film I3 are sequentially deposited on the upper surface of the second insulating film I2. The sixth insulating film I6 is made of, for example, silicon nitride (Si$_3$N$_4$) and the thickness thereof is, for example, about 50 to 100 nm. The third insulating film I3 is made of, for example, silicon oxide (SiO$_2$) and the thickness thereof is, for example, about 1 μm.

Figure 19:
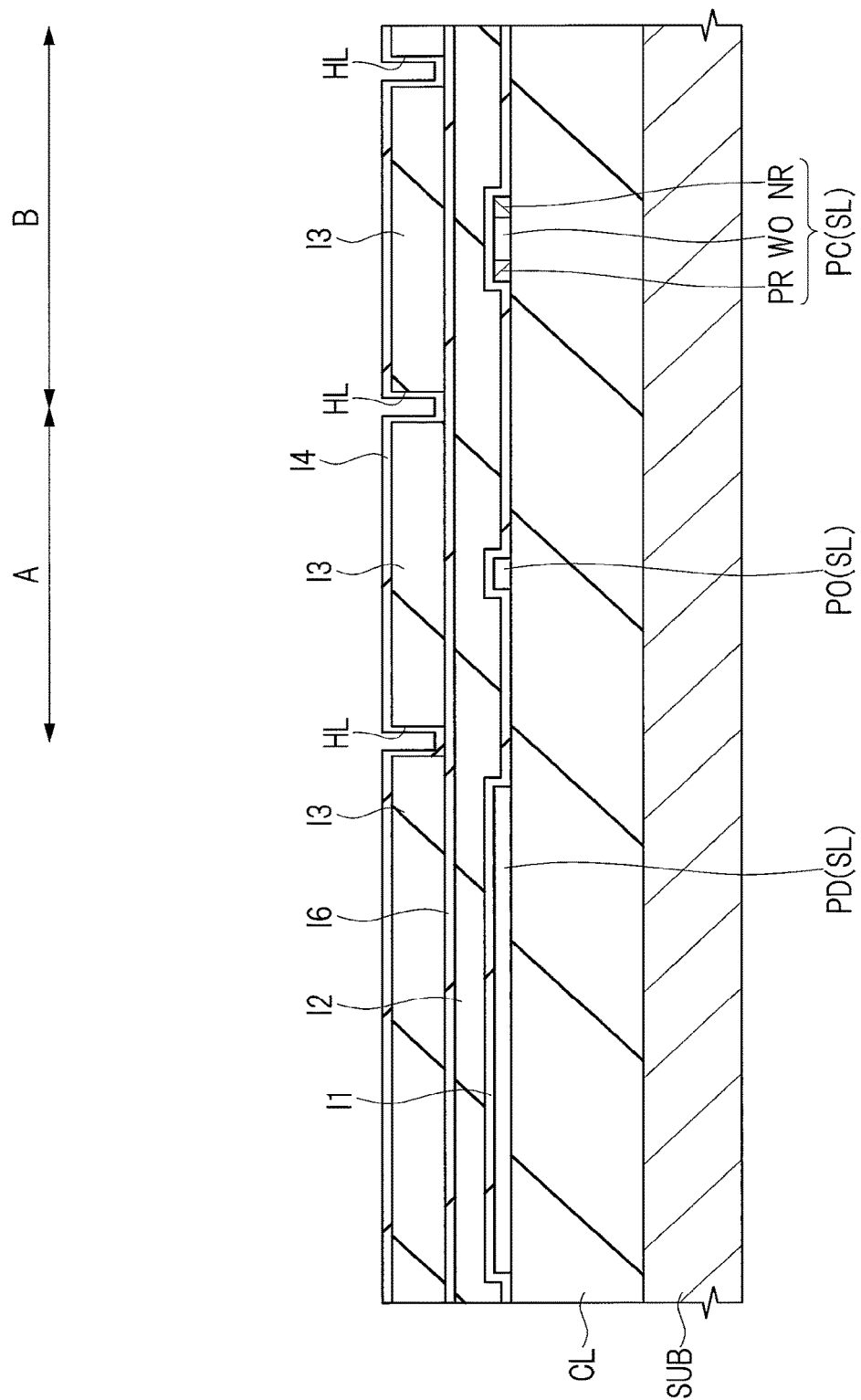
FIG. 19 is a cross-sectional view showing the principal part of the manufacturing process of a semiconductor device continued from FIG. 18.

Next, as shown in FIG. 19, the holes HL reaching the sixth insulating film I6 are formed in the third insulating film I3. The diameter of each hole HL is, for example, about 0.5 μm. The holes HL are formed at positions distant from each of the optical waveguide PO and the optical modulator PC by, for example, about 5 μm when seen in a plan view. Further, in a part of the region of the optical modulation section B in which the connection holes CT1 are to be formed in the subsequent process, the hole HL is provided at a position distant from the connection hole CT1 by, for example, 15 μm or more.

Next, the fourth insulating film I4 is formed on the upper surface of the third insulating film I3 with the inclusion of side surfaces and bottom surfaces of the holes HL. The fourth insulating film I4 is made of, for example, silicon nitride ($Si_3N_4$) and the thickness thereof is, for example, about 50 to 100 nm.

Figure 20:
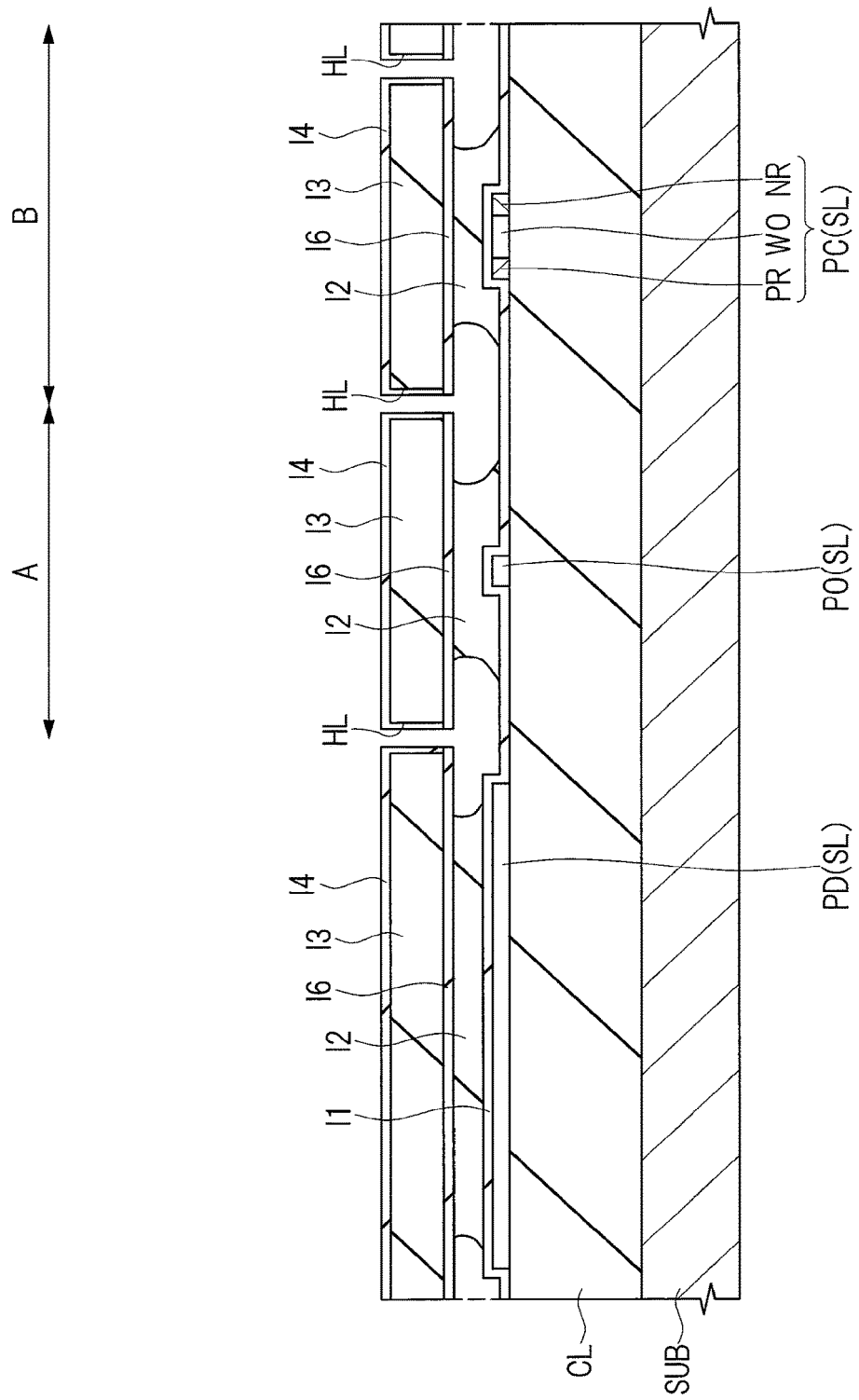
FIG. 20 is a cross-sectional view showing the principal part of the manufacturing process of a semiconductor device continued from FIG. 19.
Figure 21:
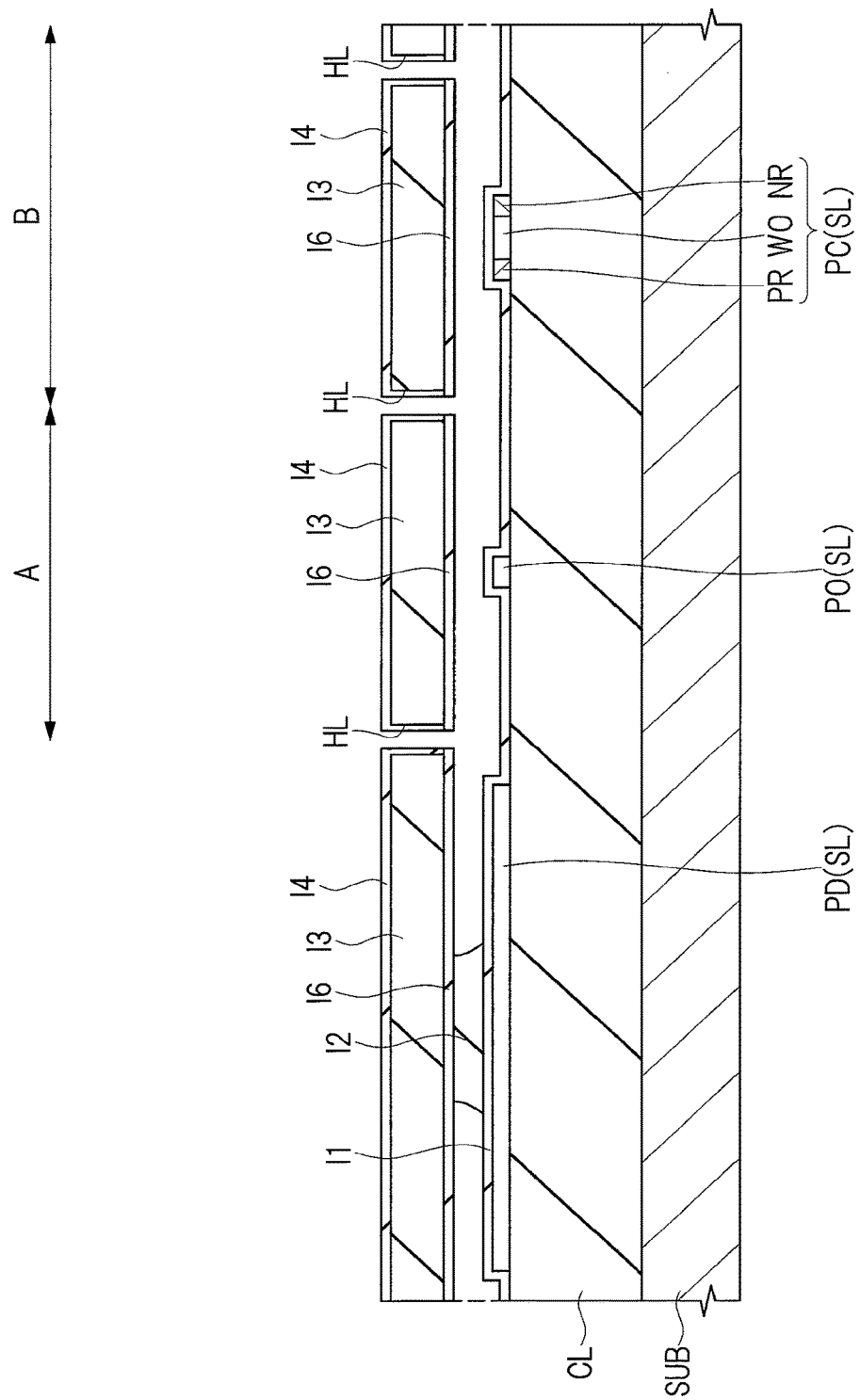
FIG. 21 is a cross-sectional view showing the principal part of the manufacturing process of a semiconductor device continued from FIG. 20.

Next, as shown in FIG. 20 and FIG. 21, the sixth insulating film I6 and the fourth insulating film I4 at the bottom surfaces of the holes HL are removed by, for example, dry etching, and then a part of the second insulating film I2 is removed by, for example, wet etching. At this time, by supplying the etchant from the bottom surface of each hole HL, the second insulating film I2 located above the optical waveguide PO and the optical modulator PC with the first insulating film I1 interposed therebetween is removed. Meanwhile, the second insulating film I2 located in the region in which the dummy pattern PD is formed and in apart of the region of the optical modulation section B in which the connection holes CT1 are to be formed in the subsequent process is partially left.

For example, with respect to the optical waveguide PO formed at the position distant from the hole HL by about 5 μm, the second insulating film I2 located above the optical waveguide PO is removed when the etching of the second insulating film I2 stating from the bottom surface of the hole HL proceeds by, for example, 10 μm. Similarly, with respect to the optical modulator PC formed at the position distant from the hole HL by about 5 μm, the second insulating film I2 located above the optical modulator PC is removed when the etching of the second insulating film I2 starting from the bottom surface of the hole HL proceeds by, for example, 10 μm.

However, even when the etching starts from an end portion of the dummy pattern PD and the etching of the second insulating film I2 proceeds by about 10 μm from the end portion of the dummy pattern PD, the second insulating film I2 above the dummy pattern PD is not completely removed and is partially left because one side of the dummy pattern PD is about 30 to 50 μm. Also, in the part of the region of the optical modulation section B in which the connection holes CT1 are to be formed in the subsequent process, the hole HL is provided at a position distant from the connection hole CT1 by, for example, 15 μm or more, and thus the second insulating film I2 in the part of the region of the optical modulation section B in which the connection holes CT1 are formed is left.

Consequently, the second insulating film I2 is partially left to have the hollow structure with a cavity.

Figure 22:
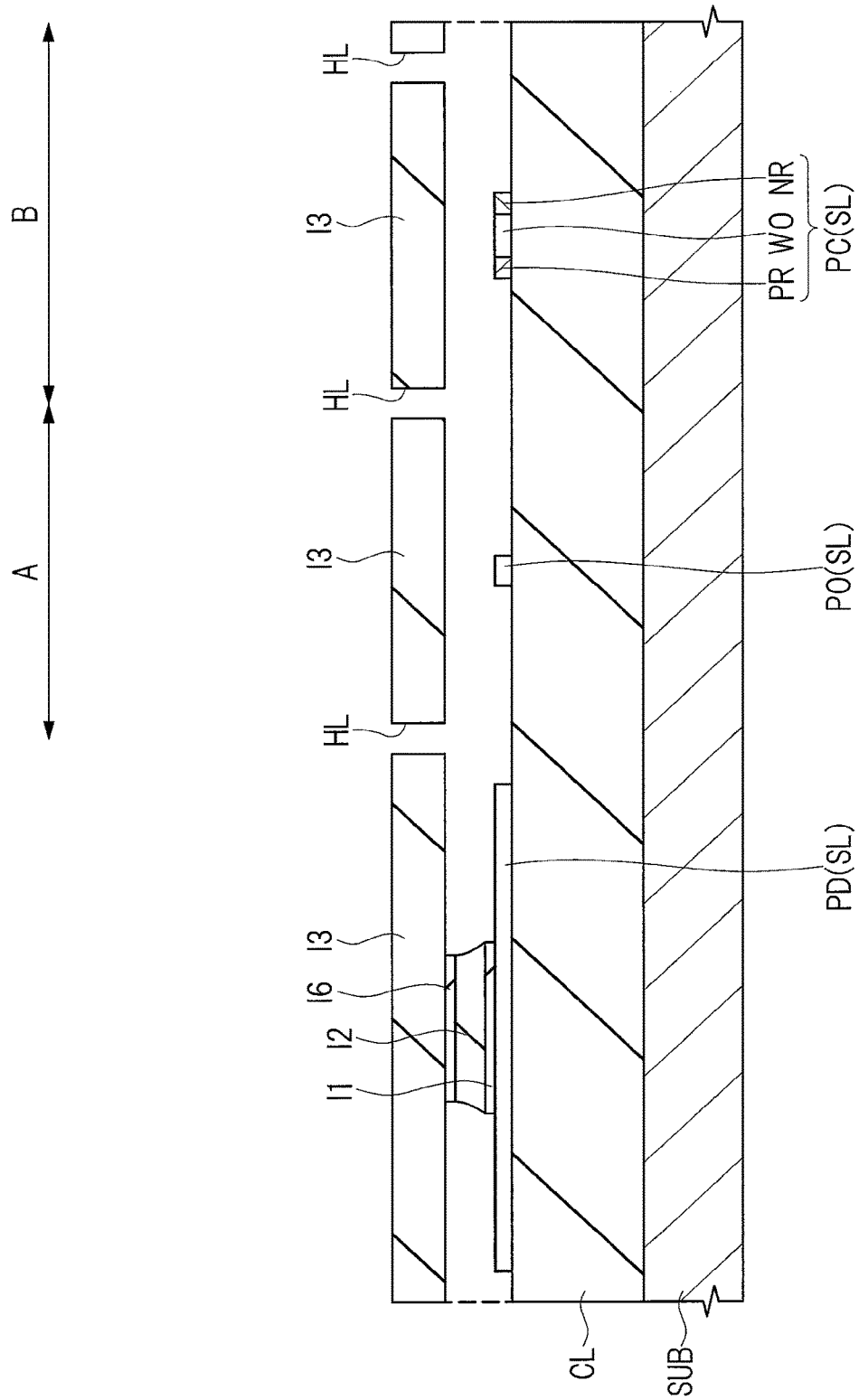
FIG. 22 is a cross-sectional view showing the principal part of the manufacturing process of a semiconductor device continued from FIG. 21.

Next, as shown in FIG. 22, the exposed first insulating film I1, fourth insulating film I4 and sixth insulating film I6 are removed by, for example, hot phosphoric acid. Consequently, the both side surfaces and the upper surfaces of the semiconductor layers SL constituting the optical waveguide PO and the optical modulator PC are exposed to air.

Figure 23:
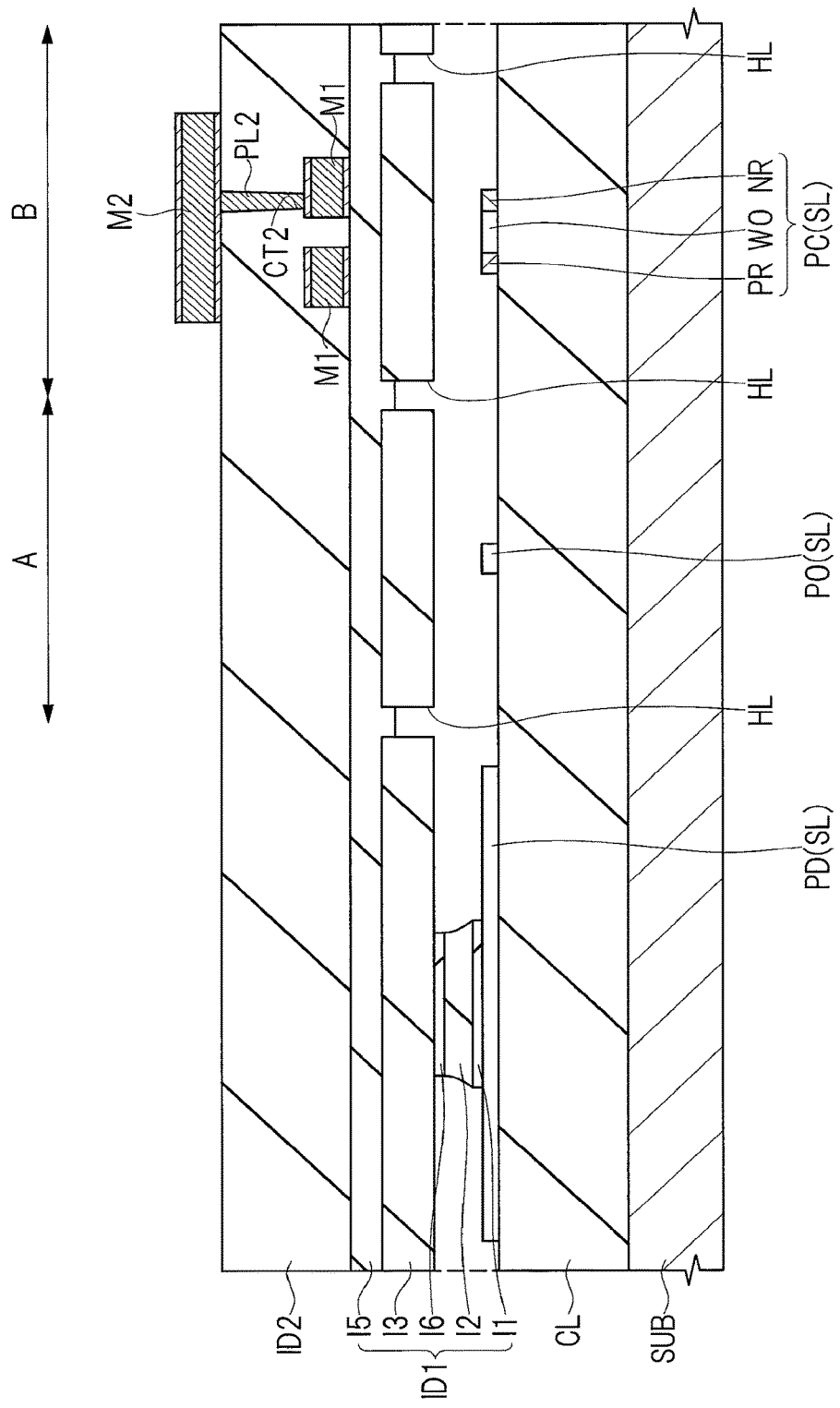
FIG. 23 is a cross-sectional view showing the principal part of the manufacturing process of a semiconductor device continued from FIG. 22.

Next, as shown in FIG. 23, the fifth insulating film I5 is formed on the upper surface of the third insulating film I3. The fifth insulating film I5 is made of silicon oxide ($SiO_2$) formed by, for example, plasma CVD and a thickness thereof is, for example, about 500 nm. Subsequently, the upper surface of the fifth insulating film I5 is planarized by, for example, CMP, so that the first interlayer insulating film ID1 made up of the first insulating film I1, the second insulating film I2, the third insulating film I3, the fifth insulating film I5 and the sixth insulating film I6 is formed.

Next, in the same manner as the first embodiment described above, the first plug PL1 (not illustrated) is formed in the first interlayer insulating film ID1, and the first-layer wiring M1 electrically connected to the first plug PL1 is formed. Further, after the second interlayer insulating film ID2 is formed so as to cover the first-layer wiring M1, the second plug PL2 is formed in the second interlayer insulating film ID2 and the second-layer wiring M2 electrically connected to the second plug PL2 is formed.

Thereafter, as shown in FIG. 17, the protection film TC is formed so as to cover the second-layer wiring M2 and then the protection film TC is processed to expose the upper surface of the second-layer wiring M2. Consequently, the semiconductor device of the third embodiment is almost completed.

As described above, since the intervals between the adjacent semiconductor layers SL can be reduced to less than 2 μm in the third embodiment, it is possible to achieve the high-density integration of the semiconductor device and the size reduction of the semiconductor chip.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device, comprising:
    (a) preparing an SOI substrate having a semiconductor substrate, an insulating layer on the semiconductor substrate and a semiconductor layer on the insulating layer;
    (b) processing the semiconductor layer to form a plurality of optical waveguides made of the semiconductor layer;
    (c) filling spaces between adjacent optical waveguides with a first insulating film;
    (d) forming a second insulating film on the optical waveguides and the first insulating film;
    (e) forming a hole penetrating through the first insulating film and the second insulating film;
    (f) forming a third insulating film on the second insulating film with an inclusion of side surfaces and a bottom surface of the hole;
    (g) removing the third insulating film at a bottom surface of the hole;
    (h) supplying etchant from the hole to etch the insulating layer, thereby forming a cavity in the insulating layer and exposing side surfaces and lower surfaces of the optical waveguides; and
    (i) removing the first insulating film and the third insulating film.

2. The manufacturing method of a semiconductor device according to claim 1,
    wherein the insulating layer and the second insulating film are made of silicon oxide, and
    the first insulating film and the third insulating film are made of silicon nitride or silicon oxynitride.

3. A manufacturing method of a semiconductor device, comprising:

(a) preparing an SOI substrate having a semiconductor substrate, an insulating layer on the semiconductor substrate and a semiconductor layer on the insulating layer;
(b) processing the semiconductor layer to form a plurality of optical waveguides made of the semiconductor layer;
(c) filling spaces between adjacent optical waveguides with a first insulating film;
(d) forming a second insulating film on the optical waveguides and the first insulating film;
(e) forming a hole penetrating through the second insulating film in the second insulating film on the first insulating film; and
(f) supplying etchant from the hole to etch the first insulating film, thereby exposing side surfaces of the optical waveguides.

4. The manufacturing method of a semiconductor device according to claim 3,
wherein the insulating layer and the second insulating film are made of silicon oxide, and
the first insulating film is made of silicon nitride or silicon oxynitride.

* * * * *